US010414175B2

(12) United States Patent
Sun

(10) Patent No.: US 10,414,175 B2
(45) Date of Patent: Sep. 17, 2019

(54) PRINTING APPARATUS CONFIGURED TO PRINT ON TAPE

(71) Applicant: Brother Kogyo Kabushiki Kaisha, Nagoya-shi, Aichi-ken (JP)

(72) Inventor: Yongqi Sun, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 15/711,676

(22) Filed: Sep. 21, 2017

(65) Prior Publication Data

US 2018/0015739 A1 Jan. 18, 2018

Related U.S. Application Data

(63) Continuation of application No. PCT/JP2016/076801, filed on Sep. 12, 2016.

(30) Foreign Application Priority Data

Sep. 28, 2015 (JP) ................................ 2015-189413

(51) Int. Cl.
*B41J 11/00* (2006.01)
*B41J 3/36* (2006.01)
(Continued)

(52) U.S. Cl.
CPC ............... *B41J 11/008* (2013.01); *B41J 3/36* (2013.01); *B41J 3/4075* (2013.01); *B41J 11/663* (2013.01);
(Continued)

(58) Field of Classification Search
CPC ...................................................... B41J 11/008
(Continued)

(56) References Cited

U.S. PATENT DOCUMENTS 5,458,423 A * 10/1995 Sims ..................... B41J 3/4075 400/621
6,371,671 B1 * 4/2002 Sato ...................... H01H 3/125 400/472

(Continued)

FOREIGN PATENT DOCUMENTS

CN 201134193 Y 10/2008
CN 104364084 A 2/2015

(Continued)

OTHER PUBLICATIONS

Dec. 6, 2016 (WO) English Translation of the Written Opinion of the International Searching Authority—App. PCT/JP2016/076801.

(Continued)

*Primary Examiner* — Anthony H Nguyen
(74) *Attorney, Agent, or Firm* — Banner & Witcoff, Ltd.

(57) ABSTRACT

A printing apparatus includes a conveying portion, a printing portion, and a controller. The controller controls the conveying portion and the printing portion based on first data and second data. The controller is configured to generate a first print label set and a second print label set. The first print label set includes first label portion on which printing is performed based on one piece of the first data and non-label portion on which printing is performed based on one piece of the second data adjacent to the first label portion. The second print label set includes second label portion on which printing is performed based on remaining one piece of the first data and non-label portion on which printing is performed based on remaining one piece of the second data adjacent to the second label portion.

9 Claims, 24 Drawing Sheets

(51) Int. Cl.

| | |
|---|---|
| ***G09F 3/00*** | (2006.01) |
| ***B41J 3/407*** | (2006.01) |
| ***B41J 11/66*** | (2006.01) |
| ***G06K 15/16*** | (2006.01) |
| ***G01R 31/02*** | (2006.01) |
| ***G06K 15/02*** | (2006.01) |
| ***G09F 3/20*** | (2006.01) |

(52) U.S. Cl.
CPC ......... *G01R 31/023* (2013.01); *G06K 15/022* (2013.01); *G06K 15/024* (2013.01); *G06K 15/16* (2013.01); *G09F 3/00* (2013.01); *G09F 3/205* (2013.01); *G06K 2215/0097* (2013.01)

(58) Field of Classification Search
USPC ........................................................ 400/615.2
See application file for complete search history.

(56) References Cited

U.S. PATENT DOCUMENTS

| | | | | |
|---|---|---|---|---|
| 6,857,801 | B2 * | 2/2005 | Van Bever | B41J 3/4075 40/316 |
| 7,303,342 | B2 * | 12/2007 | Yamamoto | B41J 3/4075 400/61 |
| 7,534,476 | B2 * | 5/2009 | Banks | G06K 19/041 283/81 |
| 9,070,054 | B2 | 6/2015 | Guan et al. | |
| 9,168,724 | B2 | 10/2015 | Kanamura et al. | |
| 9,227,437 | B2 | 1/2016 | Ando et al. | |
| 2004/0208682 | A1 * | 10/2004 | Akaiwa | B41J 3/4075 400/613 |
| 2005/0105104 | A1 * | 5/2005 | Sakai | B41J 3/4075 358/1.1 |
| 2006/0228150 | A1 * | 10/2006 | Hosokawa | B41J 3/32 400/613 |
| 2007/0172291 | A1 * | 7/2007 | Yokoyama | B41J 3/4075 400/613 |
| 2011/0295769 | A1 * | 12/2011 | Salomon | G07B 17/00661 705/406 |
| 2013/0058696 | A1 * | 3/2013 | Murayama | B41J 3/4075 400/325 |
| 2014/0076488 | A1 | 3/2014 | Kanamura et al. | |
| 2015/0022831 | A1 | 1/2015 | Guan et al. | |
| 2015/0145916 | A1 * | 5/2015 | Ando | B41J 3/4075 347/16 |
| 2016/0297217 | A1 | 10/2016 | Sasaki | |

FOREIGN PATENT DOCUMENTS

| | | | |
|---|---|---|---|
| CN | 204215658 | U | 3/2015 |
| CN | 104794986 | A | 7/2015 |
| CN | 103676540 | B | 4/2016 |
| EP | 720763 | B1 | 8/1997 |
| JP | H11-078259 | A | 3/1999 |
| JP | 2003-058062 | A | 2/2003 |
| JP | 2006-281462 | A | 10/2006 |
| JP | 2010-195021 | A | 9/2010 |
| JP | 2011-037029 | A | 2/2011 |
| JP | 2012-037853 | A | 2/2012 |
| JP | 2012-087853 | A | 5/2012 |
| JP | 5392542 | B2 | 1/2014 |
| JP | 2014-188783 | A | 10/2014 |
| JP | 2015-020394 | A | 2/2015 |
| JP | 2015-074097 | A | 4/2015 |
| WO | 94/23393 | A1 | 10/1994 |
| WO | 2013-179607 | A1 | 12/2013 |

OTHER PUBLICATIONS

Dec. 6, 2016—International Search Report—Intl App PCT/JP2016/076801.

Apr. 12, 2018—(WO) International Preliminary Report on Patentability—App PCT/JP2016/076801, Eng Tran.

Apr. 25, 2019—(CN) The First Office Action—App 201680031685.3, Eng Tran.

* cited by examiner

| CABLE NUMBER | JACK NUMBER |
|---|---|
| ... | ... |
| E845 | T013 |
| E832 | T014 |
| E866 | T015 |
| E853 | T016 |
| E887 | T017 |
| E874 | T018 |
| ... | ... |

| CABLE NUMBER | JACK NUMBER | PROCESS |
|---|---|---|
| ... | ... | ... |
| E845 | T013 | UNPROCESSED |
| E832 | T014 | UNPROCESSED ···➔PROCESSED |
| E866 | T015 | UNPROCESSED |
| E853 | T016 | UNPROCESSED |
| E887 | T017 | UNPROCESSED |
| E874 | T018 | UNPROCESSED |
| ... | ... | ... |

| ADDRESS | NAME | CATALOG NUMBER |
|---|---|---|
| ... | ... | ... |
| ... | ... | ... |
| ○CITY ○DISTRICT ○ 123 | MR. TARO NAGOYA | A03 |
| △CITY △DISTRICT △ 123 | MR. JIRO AICHI | A04 |
| □CITY □DISTRICT □ 123 | MR. ICHIRO CHUBU | A05 |
| ☆CITY ☆DISTRICT ☆ 123 | MR. JIRO HONSHU | A05 |
| ... | ... | ... |
| ... | ... | ... |

PRINTING APPARATUS CONFIGURED TO PRINT ON TAPE

CROSS REFERENCE TO RELATED APPLICATION

This application is a continuation application of International Application No. PCT/JP2016/076801 filed on Sep. 12, 2016, which claims priority from Japanese Patent Application No. 2015-189413 filed on Sep. 28, 2015. The entire contents of the earlier applications are incorporated herein by reference.

TECHNICAL FIELD

The present disclosure relates to a printing apparatus configured to print on a tape.

BACKGROUND

There is a conventional printing apparatus that prints on a tape (a tag continuous body). On a tape sheet (a mat board), a label portion (a display portion and an attaching portion) and a non-label portion are separated by an insertion, and a plurality of printing labels (sticking tags) respectively printed in the label portion are generated. In the label portion, printing data (for example, a bar code) planned to be represented in the printing label is printed. The tape is used by peeling off only the label portion from the sheet while allowing the non-label portion to remain, and by being affixed to an adherend (Product) when being used by a user.

SUMMARY

However, there is a case where a plurality of adherends to which a plurality of printing labels are respectively affixed are planned to be further associated with another material (hereinafter, suitably referred to as a "relevant material"). A case where a plurality of cables to which a printing label representing a cable number is affixed are respectively associated with a plurality of connection targets (a jack in which a plug is plugged) of the cables, and a case where a plurality of envelopes for a direct mail to which a printing label representing an address is affixed are respectively associated with the contents of the envelopes are exemplified as an example. In such cases, when the printing label is prepared, it is extremely convenient insofar as the association described above can be clearly and self-explanatorily represented. In the related art described above, such a viewpoint is not particularly considered.

An object of the disclosure is to provide a printing apparatus in which relationship between a relevant material and each adherend to which each printing label is affixed can be visually obvious, and the usability for the user can be improved.

According to one aspect, the disclosure provides a printing apparatus including a conveying portion, a printing portion, and a controller. The conveying portion is configured to convey a tape. The tape includes a first sheet in a form of an elongated rectangular shape and has a first surface, and a second sheet in a form of an elongated rectangular shape and affixed to the first surface of the first sheet. The second sheet includes two label portions and a non-label portion segmented from each other by a cut line. Each of the two label portions has a first label portion and a second label portion disposed in a longitudinal direction of the tape. The printing portion is configured to perform printing on the tape conveyed by the conveying portion. The controller is configured to acquire two pieces of first data and two pieces of second data from a data base that includes the two pieces of first data and the two pieces of second data corresponding to the two pieces of first data. The controller is configured to control the conveying portion and the printing portion based on the two pieces of first data and the two pieces of second data acquired in the acquiring. The controller is configured to generate a first print label set and a second print label set. The first print label set includes the first label portion on which printing is performed based on one piece of the first data and the non-label portion on which printing is performed based on one piece of the second data corresponding to the one piece of the first data adjacent to the first label portion. The second print label set includes the second label portion on which printing is performed based on remaining one piece of the first data and the non-label portion on which printing is performed based on remaining one piece of the second data corresponding to the remaining one piece of the first data adjacent to the second label portion.

BRIEF DESCRIPTION OF THE DRAWINGS

The particular features and advantages of the disclosure will become apparent from the following description taken in connection with the accompanying drawings, in which:

FIG. 9 is a table indicating the database;

FIG. 15 is a table indicating a configuration of a database according to a modification in which QR codes (Registered Trademark) are printed on a non-label portion;

FIG. 22 is a table indicating a configuration of a database;

DETAILED DESCRIPTION

An embodiment of the present disclosure will be described referencing to figures. In the following description, the front, rear, left, right, top, and bottom in the description will be respectively referred to as the front, rear, left, right, top, and bottom in the figures, if illustrated.

First Embodiment

Following describes a first embodiment of the present disclosure.

<Entire Structure of Printer>

The entire configuration of a printing apparatus according to the present embodiment will be described referencing to FIG. 1.

Figure 1:
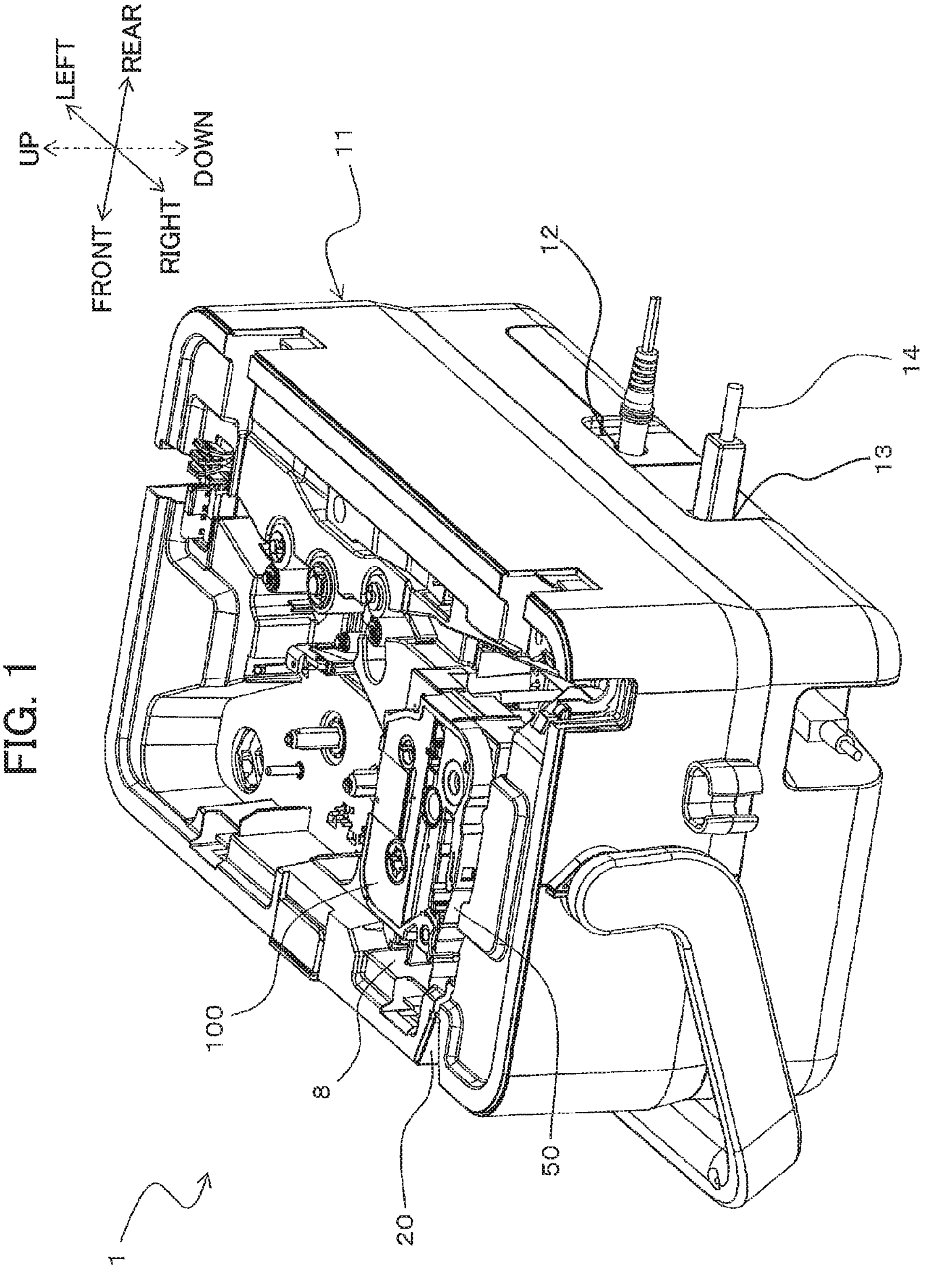
FIG. 1 is a perspective view of a printing apparatus according to a first embodiment of the present disclosure.

In FIG. 1, a printing apparatus 1 can selectively execute printing on a printing tape 50 (corresponding to a tape) and printing on a printing tube (not illustrated). While the printing apparatus 1 can execute both the printing on the printing tape 50 and printing on the printing tube in the above description, it may be configured to execute only the printing on the printing tape 50.

The printing apparatus 1 can use various types of tape cartridges 100 such as a thermal type, a receptor type, and a laminate type. Hereinafter, the printing apparatus 1 is assumed to use the tape cartridge 100 of a receptor type. Further, the printing apparatus 1 can use both the tape cartridges 100 of a type (die-cut label type) in which a cut is formed in an adhesive sheet of the printing tape 50 so as to divide the printing sheet into a label portion and a non-label portion and of a type not having the above cut in the adhesive sheet of the printing tape 50. In the example of FIG. 1, the tape cartridge 100 of a die-cut label type is used.

The printing apparatus 1 has a substantially rectangular parallelepiped main body portion 11 and a cover (not illustrated) that opens/closes an upper opening of the main body portion 11. In a state where the cover is attached to the main body portion 11 (FIG. 1 shows the printing apparatus 1 uncovered), it is pivotably supported at the upper portion of the rear end of the main body portion 11. A power supply connector 12 and a USB (Universal Serial Bus) connector 13 are provided on the lower portion of the back surface of the main body portion 11. The printing apparatus 1 is connected to an operation terminal 300 (see FIG. 4) through a USB cable 14 connected to the USB connector 13. The printing apparatus 1 receives printing data transmitted from the operation terminal 300 and performs printing on the above-described printing tape 50 based on the printing data. The printing apparatus 1 and operation terminal 300 may be connected by wireless communication. While the printing apparatus 1 is configured to execute printing based on operation of the operation terminal 300 in the above description, it may be configured to execute printing based on operation in an operation unit provided therein (so-called stand-alone type).

A cartridge holder 8 having a recessed shape to which the tape cartridge 100 provided with the printing tape 50 can be detachably attached is provided at a position close to the right side of the upper surface of the main body portion 11. To make clear the structure, the tape cartridge 100 is positioned above the actual mounting position thereof in the cartridge holder 8 in FIG. 1.

A discharge port 20 is provided at a position close to the right side of the front surface of the main body portion 11. The printing tape 50 after printing by a thermal head 22 to be described later is discharged while being conveyed by a platen roller 25 to be described later from the cartridge holder 8 to the outside of the printing apparatus 1 through the discharge port 20.

<Internal Structure of Printer>

The internal structure of the printing apparatus 1 will be described.

Figure 2:
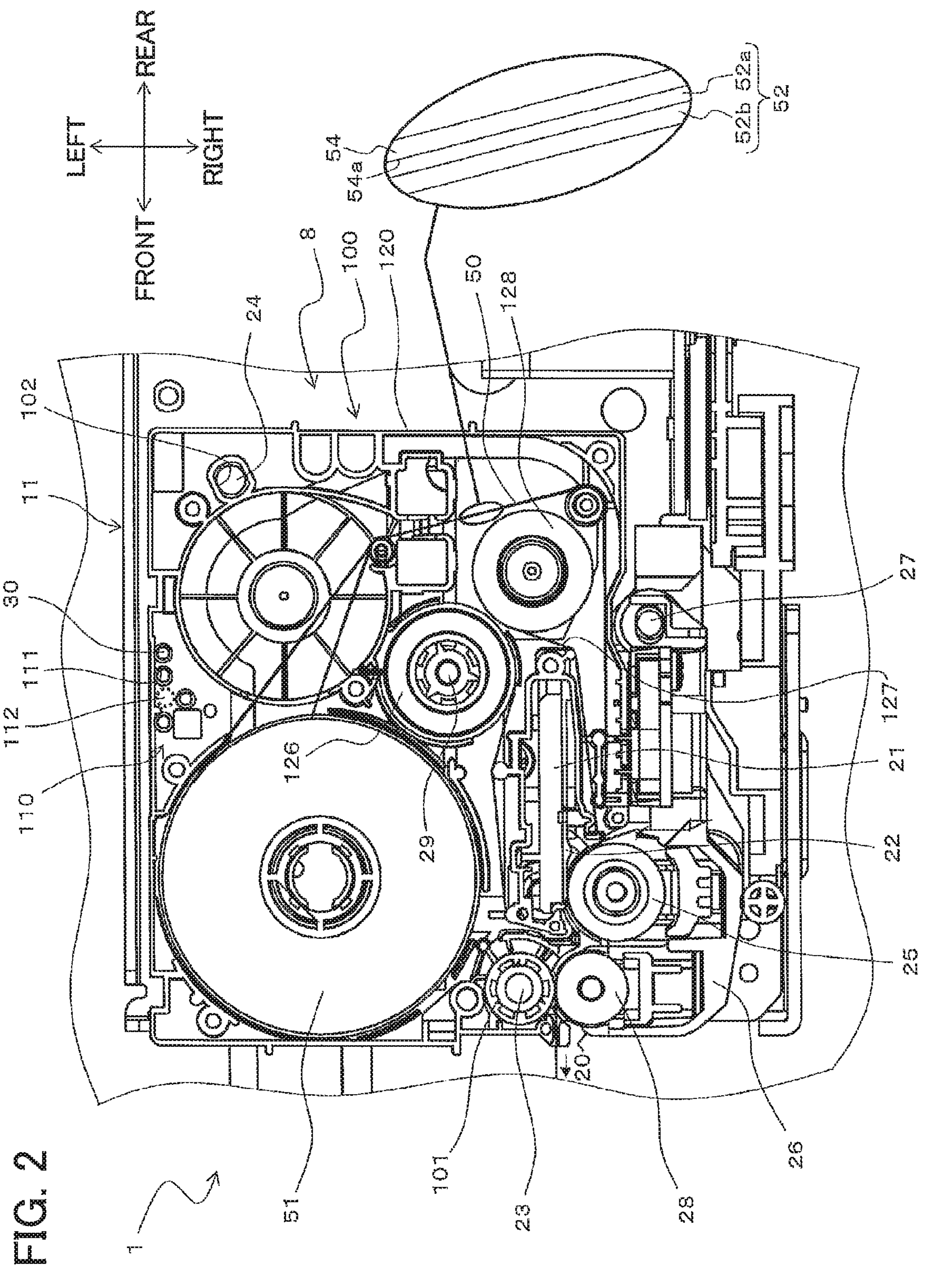
FIG. 2 is a plan view illustrating a cartridge holder of the printing apparatus and its configuration around the cartridge holder.

As illustrated in FIG. 2 and as described above, the cartridge holder 8 to which the tape cartridge 100 can be detachably attached is provided at the upper surface of the main body portion 11. A head holder 21 formed of a plate-like member extending in the front-rear direction is vertically installed at a position adjacent to the right side of substantially the center portion of the cartridge holder 8 in the front-rear direction. A thermal head 22 (corresponding to a printing part) provided with a plurality of heating elements (not illustrated) is provided on the right side surface of the head holder 21. The thermal head 22 uses an ink ribbon 127 to be described later to perform printing on the printing tape 50 supplied from the tape cartridge 100 and conveyed by a platen roller 25 along a predetermined conveying path.

A ribbon winding shaft 29 is vertically installed to the left of the head holder 21. The ribbon winding shaft 29 is fitted into the inside of a ribbon winding roller 126 provided in the tape cartridge 100 and drives the ribbon winding roller 126 into rotation. The tape cartridge 100 further has a rotatably supported ink supply side roll 128. An ink ribbon 127 is wound around the ink supply side roll 128. The ribbon winding roller 126 is driven into rotation by the ribbon winding shaft 29 to pull out the ink ribbon 127 from the ink supply side roll 128 and wind the used ink ribbon 127.

A feed roller drive shaft 23 is vertically installed to the frontward position of the head holder 21 in the cartridge holder 8. The feed roller drive shaft 23 is a shaft body that can be detachably attached to a feed roller 101 of the tape cartridge 100. A guide shaft 24 is vertically installed at a position adjacent to the left corner of the cartridge holder 8. The guide shaft 24 is a shaft body that can be detachably attached to a guide hole 102 (see FIG. 3) of the tape cartridge 100.

A drive motor 66 (see FIG. 4) as a stepping motor is disposed below the cartridge holder 8 of the main body portion 11. The ribbon winding shaft 29 and the feed roller drive shaft 23 are connected to the drive motor 66 through a plurality of unillustrated gears. With the drive of the drive motor 66, the ribbon winding shaft 29 and feed roller drive shaft 23 are rotated. The winding roller 126 is rotated by the rotation of the ribbon winding shaft 29. The feed roller drive shaft 23, the platen roller 25, and a pressure contact roller 28 (described later) are connected to each other via a gear train, which is not illustrated. Upon the drive of the feed roller drive shaft 23, the feed roller 101, the platen roller 25, and the pressure contact roller 28 are rotated.

A cartridge sensor 31 (see FIG. 4) having a plurality of (five, in this example) vertically installed push-down sensor projections 30 are provided on a lower support surface on the left side of substantially the center of the cartridge holder 8 in the front-rear direction. When the tape cartridge 100 is attached to the cartridge holder 8, a detected part 110 (the details thereof will be described later) provided in the tape cartridge 100 faces the sensor projections 30, and one sensor projection 30 corresponding to the type (for example, corresponding to the shape of a label portion 95, described later) of the tape cartridge 100 is selectively pushed down. The cartridge sensor 31 outputs a detection signal indicating type information (for example, shape information of the label portion 95) of the tape cartridge 100 based on a combination of ON and OFF of the sensor projections 30.

An arm-like platen holder 26 extending in the front-rear direction is disposed outside the upper portion of the cartridge holder 8 of the main body portion 11. The platen holder 26 is swingably axially supported about a pivot part 27. The platen roller 25 and a pressure contact roller 28 are rotatably axially supported at the front end of the platen holder 26. The feeding roller drive shaft 23, the platen roller 25, and the pressure contact roller 28 correspond to a conveying portion of each claim. The platen roller 25 faces the thermal head 22 and can contact and separate from the thermal head 22. The pressure contact roller 28 faces the feed roller 101 and can contact and separate from the feed roller 101. When the platen holder 26 is swung toward the cartridge holder 8 side to move the platen roller 25 to a printing position contacting the thermal head 22, the platen roller 25 presses the thermal head 22 through the printing tape 50. At the same time, the pressure contact roller 28 presses the feed roller 101 through the printing tape 50 and the ink ribbon 127. In this state, the printing tape 50 is conveyed with the rotation of the feed roller 101, platen roller 25, and pressure contact roller 28, whereby the ink ribbon 127 is drawn from the ink supply side roll 128 in accordance with the rotation of the ribbon winding roller 126. Accordingly, printing on the printing tape 50 is performed by the thermal head 22.

<Structure of Cartridge>

The structure of the tape cartridge 100 will be described with reference to FIGS. 2 and 3.

Figure 3:
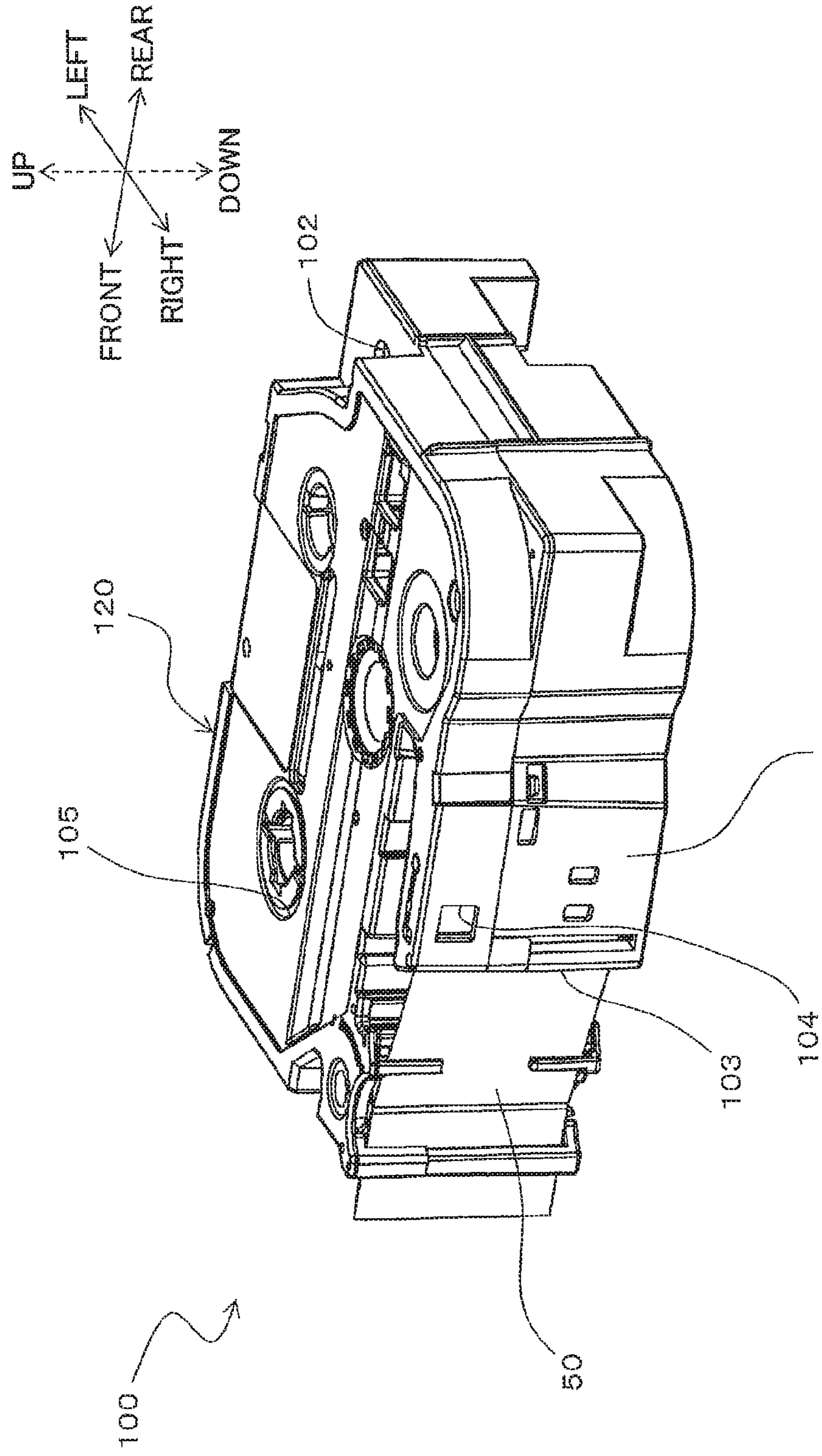
FIG. 3 is a perspective view illustrating a whole exterior of a tape cartridge.

As illustrated in FIGS. 2 and 3, the tape cartridge 100 has a substantially rectangular parallelepiped (box-like) casing 120 having rounded corners as a whole in a plan view. A tape supply port 103 is provided at the front side of the right surface of the casing 120, and the printing tape 50 is pulled out from the tape supply port 103, so as to be supplied. Further, a through hole 104 for optically detecting a sensor mark M for the positioning control in the conveyance (see FIG. 5, described later) that is previously printed on the printing tape 50 is provided in the vicinity of the upper portion of the tape supply port 103 in a side wall portion 121 of the casing 120.

A tape roll support hole 105 rotatably supporting the printing tape roll 51 around which the printing tape 50 is wound in the casing 120 is disposed on the upper front side of the casing 120. As illustrated in the partially enlarged diagram of FIG. 2, the printing tape 50 is configured by laminating the adhesive sheet 52 (corresponding to a second sheet) and the peeling sheet 54 (corresponding to a first sheet) in this order from a side wound on an inner side (a left side in the partially enlarged diagram of FIG. 2, and hereinafter, suitably referred to as a "front side") towards a side opposite to the inner side (a right side in the partially enlarged diagram of FIG. 2, and hereinafter, suitably referred to as a "rear side"). The adhesive sheet 52 is printed on a front surface of a base material **52*b* provided on a front side of the adhesive sheet 52 by the thermal head 22. In addition, the adhesive sheet 52 includes an adhesive layer 52*a* on a rear side of the base material 52*b*. The peeling sheet 54 is disposed to be easily peelable with respect to the adhesive layer 52*a*. That is, the adhesive sheet 52 is affixed to a front surface 54*a* (corresponding to a first surface) of the peeling sheet 54 to be peelable, and in this embodiment, the printing tape 50 is configured by sticking the elongated-rectangular shaped adhesive sheet 52 to the entire elongated-rectangular shaped peeling sheet 54 having a length in the conveying direction of the platen roller 25 is longer than a length in a widthwise direction of tape. The printing tape 50 is drawn out from the printing tape roll 51, and is printed by the thermal head 22, and then, is guided towards the discharge port 20 of the main body portion 11**.

The above-described detected part 110 indicating the type information of the tape cartridge 100 is provided at substantially the left-rear center on the front lower surface of the casing 120. The detected part 110 indicates the type information of the tape cartridge 100 by a combination of an insertion hole 111 and a surface part 112 formed on the lower surface that faces the five sensor projections 30 of the cartridge sensor 31 provided in the main body portion 11.

The insertion hole 111 is a circular hole and functions as a non-push-down part that does not push down the sensor projection 30 when the tape cartridge 100 is attached to the cartridge holder 8, with the result that the sensor projection 30 facing the insertion hole 111 comes into an OFF state. The surface part 112 functions as a push-down part that pushes down the sensor projection 30 when the tape cartridge 100 is attached to the cartridge holder 8, with the result that the sensor projection 30 facing the surface part 112 comes into an ON state.

<Control Systems for Printer and Operation Terminal>

Control systems for the respective printing apparatus 1 and operation terminal 300 will be described with reference to FIG. 4.

Figure 4:
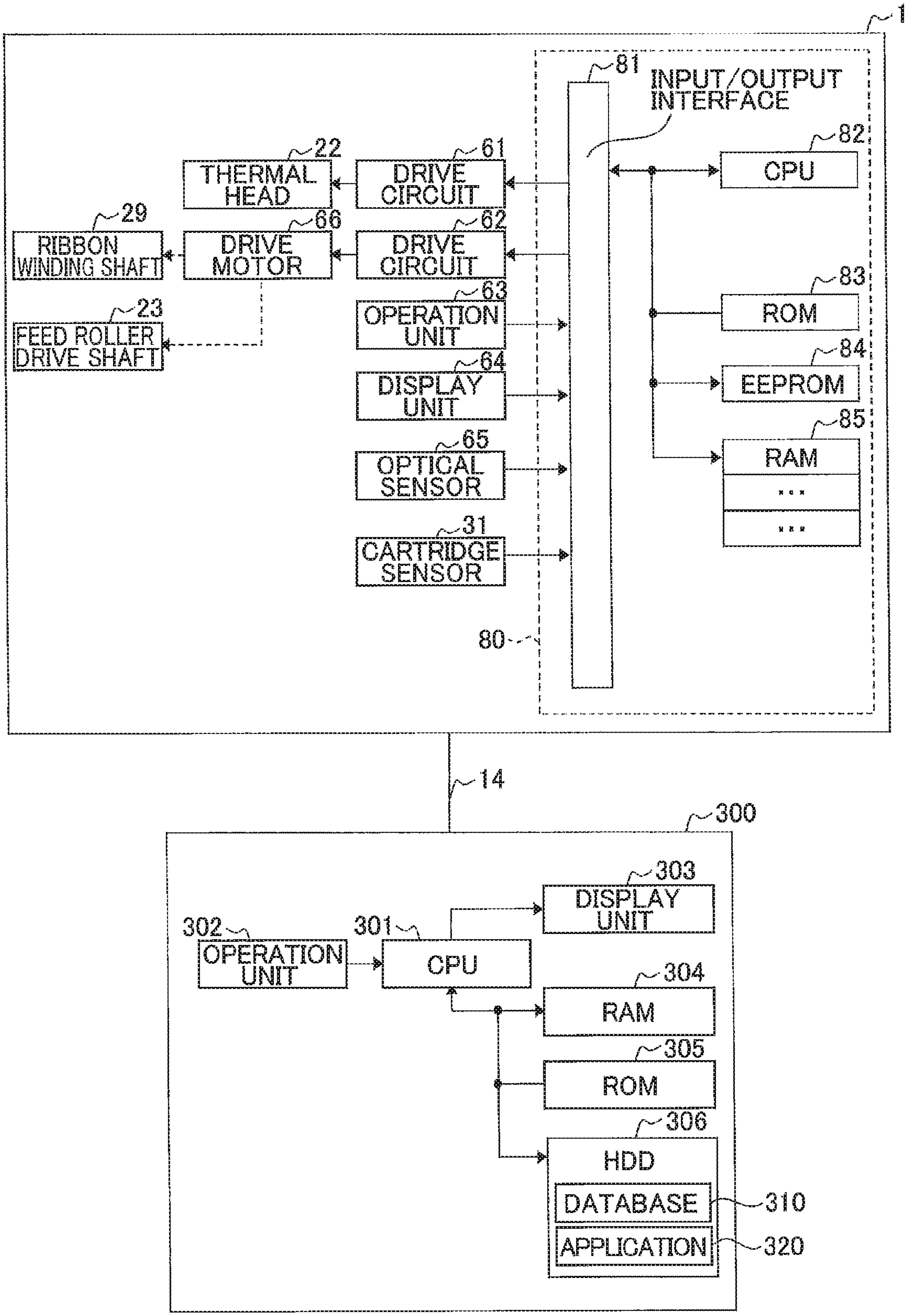
FIG. 4 illustrates a block diagram indicating a control system of the printing apparatus and operation terminal.

As illustrated in FIG. 4, the printing apparatus 1 is provided with a control system having a control circuit 80 including a CPU 82 (corresponding to a controller). In the control circuit 80, the CPU 82 is connected to a ROM 83, an EEPROM 84, a RAM 85, and an I/O interface 81 through a data bus. In place of the EEPROM 84, a non-volatile memory such as a flash memory may be used.

Figure 12:
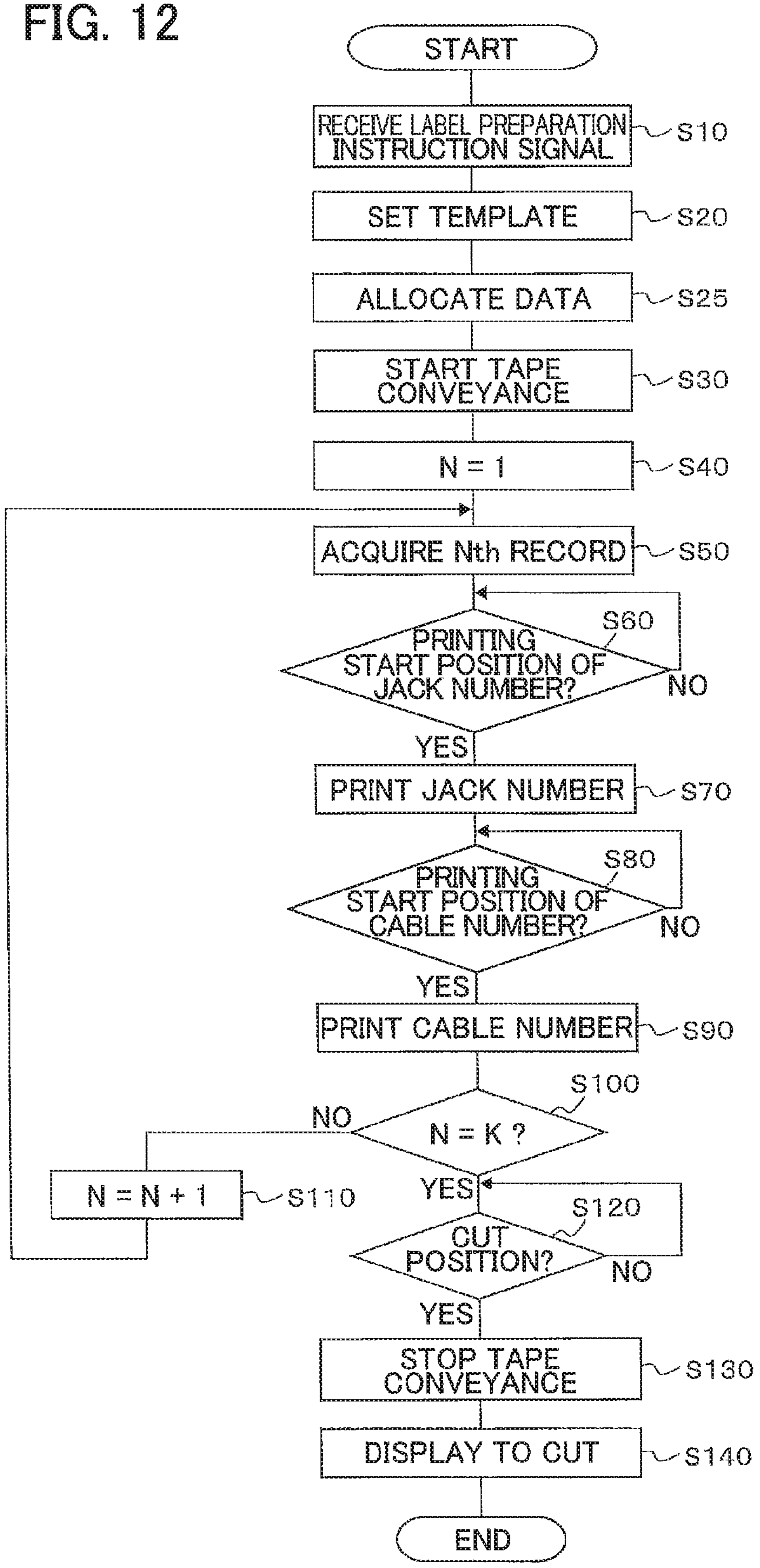
FIG. 12 is a flowchart indicating control procedures that a CPU of the printing apparatus performs.

The ROM 83 stores various programs (including a control program for executing each procedure of the processing flow of FIG. 12) required to control the printing apparatus 1. The CPU 82 performs various computations and processing based on the programs stored in the ROM 83 with employing the volatile memory function of the RAM 85 whereby the CPU 82 entirely controls the printing apparatus 1.

The EEPROM 84 stores various kinds of information (e.g., correlation information associating various detection results of the cartridge sensor 31 obtained based on the states of the insertion hole 111 and surface part 112 with the type information of the tape cartridge 100) concerning the printing tape 50 in a non-volatile manner. The CPU 82 refers to the correlation information with respect to the detection result concerning the tape cartridge 100 attached to the cartridge holder 8 to thereby acquire the type information of the currently attached tape cartridge 100.

The I/O interface 81 is connected to a thermal head drive circuit 61, a motor drive circuit 62, an operation unit 63, a display unit 64, an optical sensor 65, and the cartridge sensor 31.

The thermal head drive circuit 61 controls the drive of the thermal head 22.

The motor drive circuit 62 controls the drive of the drive motor 66, which drives the ribbon winding shaft 29 and the feeding roller drive shaft 23.

The optical sensor 65 projects sensor light to the printing tape 50 through the through hole 104 formed in the casing 120 of the tape cartridge 100 and detects the presence/absence of its reflected light to thereby detect a conveying state of the printing tape 50.

The operation terminal 300 is provided with a control system having a CPU 301. The CPU 301 is connected to an operation unit 302, a display unit 303, a RAM 304, a ROM 305, and an HDD 306.

The operation terminal 300 is connected to the printing apparatus 1 through the USB cable 14 and can thus exchange signals with the printing apparatus 1.

In the operation terminal 300, an application program 320 stored in the HDD 306 is suitably executed. By the application program 320, the user can operate an operation unit 302 on an operation terminal 300 to thereby generating printing data for forming printings on a printing label L prepared in the printing apparatus 1, and the user can transmit the printing data to the printing apparatus 1. Further, the database 310 (described later) is stored in the HDD 306.

That is, a predetermined label creation instruction including the printing data is transmitted to and received by the printing apparatus 1 by a user operation on the operation unit 302 of the operation terminal 300. Then, in the printing apparatus 1, the ribbon winding shaft 29 and feeding roller drive shaft 23 are driven through the motor drive circuit 62 and the drive roller 66, and the printing tape 50 is drawn out from the printing tape roll 51 in the tape cartridge 100. Accordingly, the ink ribbon 127 is drawn from the ink supply side roll 128. In synchronization with this, a plurality of heating elements of the thermal head 22 are selectively heated through the thermal head drive circuit 61, and printing based on the printing data is performed on the printing tape 50 delivered and conveyed by transferring the ink of the ink ribbon 127. Thereafter, the label portion 95 (described later) are manually peeled off from the printing tape 50, whereby a printing label L having a predetermined printing is generated. The above peel-off may be performed as follows. That is, the printing tape 50 is cut into a predetermined length by an unillustrated cutter provided near the discharge port 20 of the main body portion 11 and then discharged from the discharge port 20, and the winding part 90 and label main body portion 91 are peeled off from the discharged printing tape 50 of the predetermined length. The cutter for cutting the printing tape 50 is activated when an unillustrated cutter button is operated.

<Structure of Printing Tape>

Next, the structure of the printing tape 50 used in this embodiment will be described with reference to FIG. 5. In FIGS. 5A and 5B, a plan view of the printing tape 50 before being printed and a plan view of the printing tape 50 after being printed are respectively illustrated in which a right-left direction in the drawing is set to the conveying direction (in other words, a tape length direction), an up-down direction in the drawing is set to the widthwise direction of tape, and a front and rear direction of the plane in the drawing is set to a tape thickness direction.

<External Appearance of Printing Tape Before being Printed>

Figure 5A:
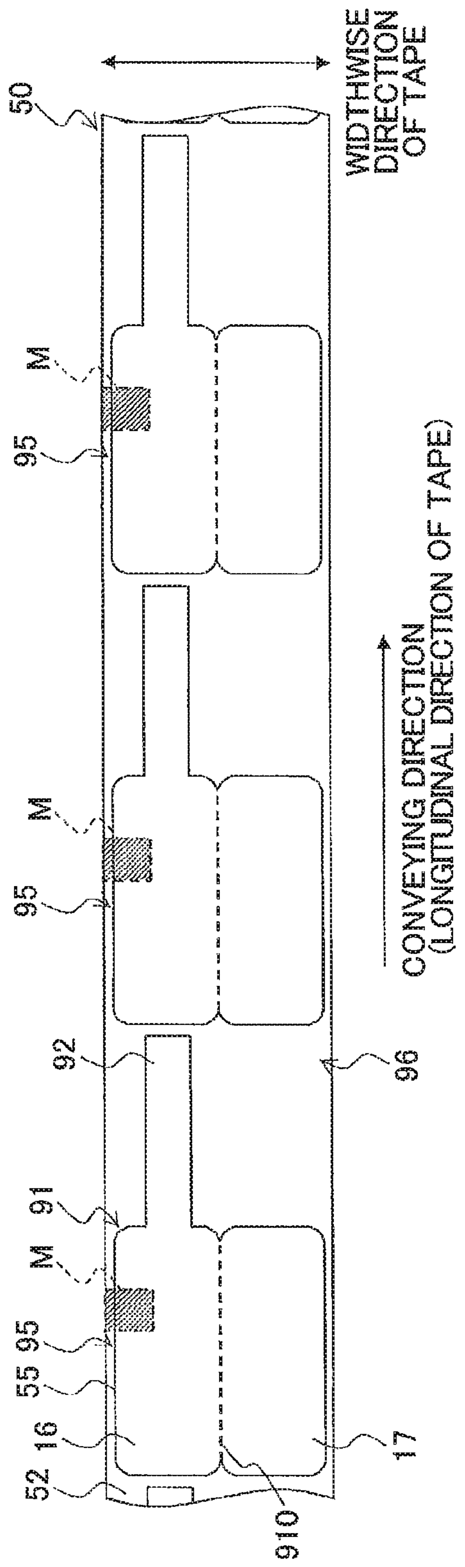
FIG. 5A is a plan view illustrating an exterior of a printing tape before printing.

In FIG. 5A, as described above, the printing tape 50 is configured by peelably sticking the elongated-rectangular shaped adhesive sheet 52 including the base material **52*b* on the front side and the adhesive layer 52*a* on the rear side to the front surface 54*a* of the peeling sheet 54** having an elongated-rectangular shape.

As illustrated in FIG. 5A, in the printing tape 50, half cutting processing is performed in advance in the shape for preparing a label portion. The half cutting processing is processing of forming a cut line 55 passing through the adhesive sheet 52 of the printing tape 50 in the tape thickness direction, and forms a so-called die cutting label. The cut line 55 is formed to surround a predetermined region, and thus, an inner portion of the region of the adhesive sheet 52 can be peeled off from the printing tape 50. Thus, the inner portion of the region of the adhesive sheet 52, which is a peeling target, is a label portion 95, and a portion other than the label portion 95 (an outer portion of the region) is a non-label portion 96. In the printing tape 50, a plurality of label portions 95 are arranged at predetermined intervals along the conveying direction.

On the rear surface of the peeling sheet 54, a plurality of sensor marks M are formed in advance by printing at predetermined intervals (identical to the interval between the label portions 95) along the conveying direction. The sensor mark M is formed in a region spreading in the widthwise direction of tape that faces and passes through the through hole 104 during the conveyance of the printing tape 50, in the rear surface of the peeling sheet 54. In the printing apparatus 1, the optical sensor 65 optically detects the sensor mark M through the through hole 104, and a conveyed position of the label portion 95 is continuously sensed by the CPU 82 on the basis of a detection result, and thus, positioning control at the time of transporting the printing tape 50 is controlled.

Each of the label portions 95 includes a label main body portion 91, and one winding portion 92 connected to the label main body portion 91. Furthermore, two or more winding portions may be provided in each of the label portions 95.

In substantially a central portion of the label main body portion 91 in the widthwise direction of tape, a perforation 910 is formed in advance along the conveying direction by the half cutting processing, as a folding line for folding the label main body portion 91. Furthermore, a straight line printed in advance may be provided as the folding line. The label main body portion 91 has substantially a line symmetric shape with respect to the perforation 910, and in this example, has substantially a horizontal rectangular shape in which the conveying direction is aligned to its longitudinal direction, and the widthwise direction of tape is aligned to its transverse direction. The label main body portion 91 includes a first label region 16 which is a portion on one side (an upper side of the drawing) in the widthwise direction of tape from the perforation 910, and a second label region 17 which is a portion on the other side (a lower side of the drawing) in the widthwise direction of tape from the perforation 910. In this example, each of the label regions 16 and 17 has substantially a horizontal rectangular shape in which the conveying direction is aligned to its longitudinal direction, and the widthwise direction of tape is aligned to its transverse direction.

The winding portion 92 protrudes from an end portion on a downstream side (a right side of the drawing) of the first label region 16 in the conveying direction, and has substantially a horizontal rectangular shape in which the conveying direction is aligned to its longitudinal direction, and the widthwise direction of tape is aligned to its transverse direction. Furthermore, the winding portion 92 may protrude from an end portion of the first label region 16 on an upstream side (a left side of the drawing) in the conveying direction. Alternatively, the winding portion 92 may protrude from an end portion on a downstream side or an end portion on an upstream side of the second label region 17 in the conveying direction. The dimension of the winding portion 92 in the widthwise direction of tape is smaller than the dimension of the first label region 16 in the widthwise direction of tape, and the dimension of the winding portion 92 in the conveying direction is smaller than the dimension of the first label region 16 in the conveying direction. Furthermore, the dimension of the winding portion 92 in the conveying direction may be equal to or larger than the dimension of the first label region 16 in the conveying direction.

Printing data to be represented on a printing label L is printed in each of the label regions 16 and 17 in the label portion 95 of the printing tape 50, which is the configuration described above, by the thermal head 22. The printing label L in which the printing data is printed is generated in each of the label regions 16 and 17.

<External Appearance of Printing Tape after being Printed>

Figure 5B:
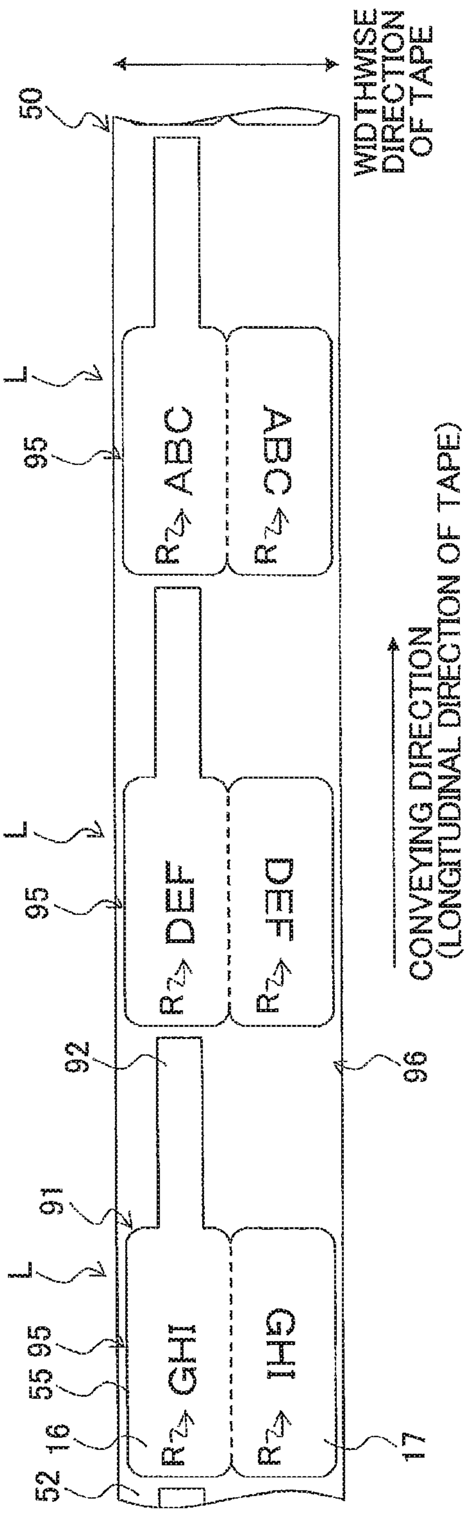
FIG. 5B is a plan view illustrating the exterior of the printing tape after printing.

In an example illustrated in FIG. 5B, the printing data is printed in each of the label regions 16 and 17 in each of the plurality of label portions 95 of the printing tape 50. A plurality of printing labels L in which the printing data is printed in each of the label regions 16 and 17, are thus generated in the printing tape 50.

Each of the printing labels L includes the label main body portion 91 in which the printing data is printed in each of the label regions 16 and 17, and the winding portion 92 as a unit. In each of the printing labels L, printing R corresponding to the printing data is printed in the first label region 16 at an upright posture along the conveying direction, and printing R corresponding to the printing data is printed in the second label region 17 at an inverted posture rotated by 180° (degrees) along the conveying direction.

<Usage Pattern of Printing Label>

Next, a usage pattern of the printing label L will be described with reference to FIG. 6 and FIG. 7.

Figure 6A:
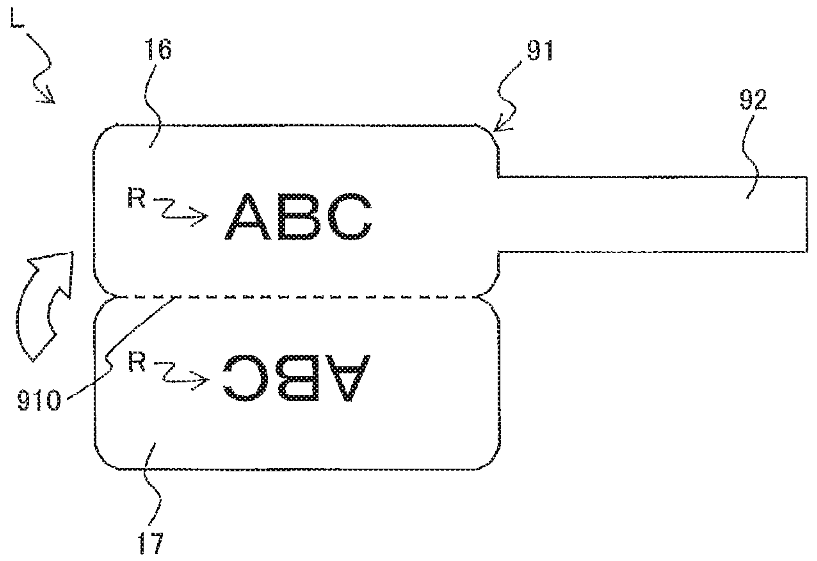
FIG. 6A is an explanatory diagram for explaining usage of a printing label and illustrates a front view of the unfolded printing label.

In FIG. 6 and FIG. 7, only a desired printing label L is peeled off from the peeling sheet 54 along the cut line 55 while allowing the non-label portion 96 in the adhesive sheet 52 of the printing tape 50 to remain, at the time of being used by the user. In FIG. 6A, the printing label L in a state of being peeled off is illustrated.

Figure 6B:
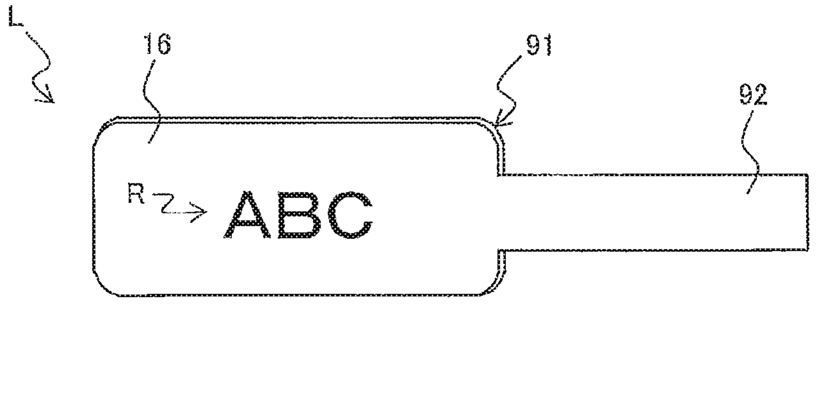
FIG. 6B is an explanatory diagram for explaining the usage of the printing label and illustrates the folded printing label.

After that, the printing label L in the state illustrated in FIG. 6A is folded such that the label main body portion 91 is in mountain fold by the perforation 910 (refer to a block arrow), and thus, rear surfaces of the label regions 16 and 17 are affixed to each other by the adhesive layer 52*a*. In FIG. 6B, the printing label L in a state where the rear surfaces of the label regions 16 and 17 are affixed to each other is illustrated.

Figure 7A:
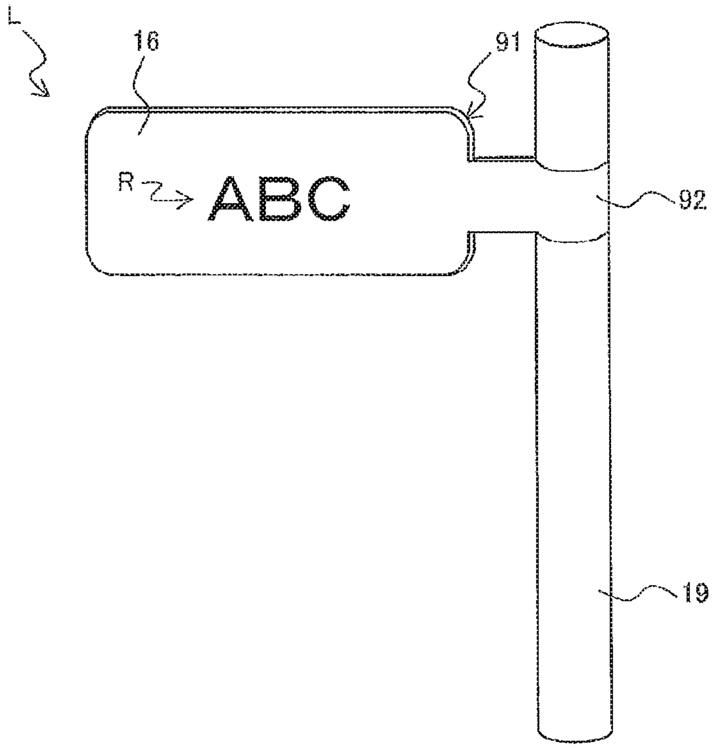
FIG. 7A is an explanatory diagram for explaining usage of the printing label and illustrates a front view of the printing label.
Figure 7B:
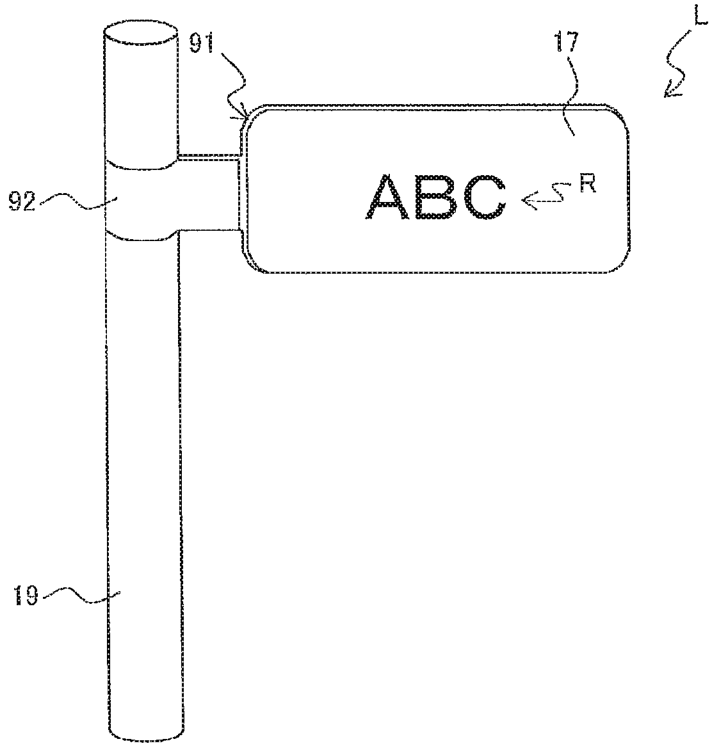
FIG. 7B is an explanatory diagram for explaining the used condition of the printing label and illustrates a rear view of the printing label.

Then, as illustrated in FIGS. 7A and 7B, the printing label L in the state illustrated in FIG. 6B is folded back after the winding portion 92 is wound such that substantially a central portion in the longitudinal direction is positioned around a cable 19, which is an adherend in the shape of a cable (or may be in the shape of a circular tube), having the up-down direction of the drawing as an axis center direction. After that, overlapping portions formed by the folding back of the winding portion 92 adheres through the adhesive layer 52*a* on the rear surface of the winding portion 92, and the winding portion of the winding portion 92 adheres around the cable 19.

As described above, the printing label L is attached to the cable 19, and can be used as a P type label in which the overlapping label regions 16 and 17 protrude to a direction perpendicular to the axis center direction of the cable 19 (in the drawing, the right-left direction) from the winding portion 92 (that is, the entire printing label L including the cable 19 is in the shape of "P").

FIG. 7A illustrates the external appearance in a case where the printing label L, which is attached to the cable 19 and is used as the P type label, is seen from the front side (the first label region 16 side). As illustrated in FIG. 7A, in the first label region 16, a character string of "ABC" is represented on the front surface at the upright posture as the printing R. FIG. 7B illustrates the external appearance in a case where the printing label L, which is attached to the cable 19 and is used as the P type label, is seen from the rear side (the second label region 17 side). As illustrated in FIG. 7B, in the second label region 17, the character string of "ABC" is represented on the front surface at the upright posture as the printing R.

<Problem>

However, there is a case where a plurality of cables 19 to which each of the plurality of printing labels L is affixed, is planned to be further associated with another material (hereinafter, suitably referred to as a "relevant material"). For example, as illustrated in FIG. 8, there is a case where the plurality of cables 19 to which each of the printing labels L representing a cable number CN is affixed, are planned to be respectively associated with a plurality of jacks 42 on a connection equipment 41 side, in which plugs 40 on a tip end side are respectively plugged.

Figure 8:
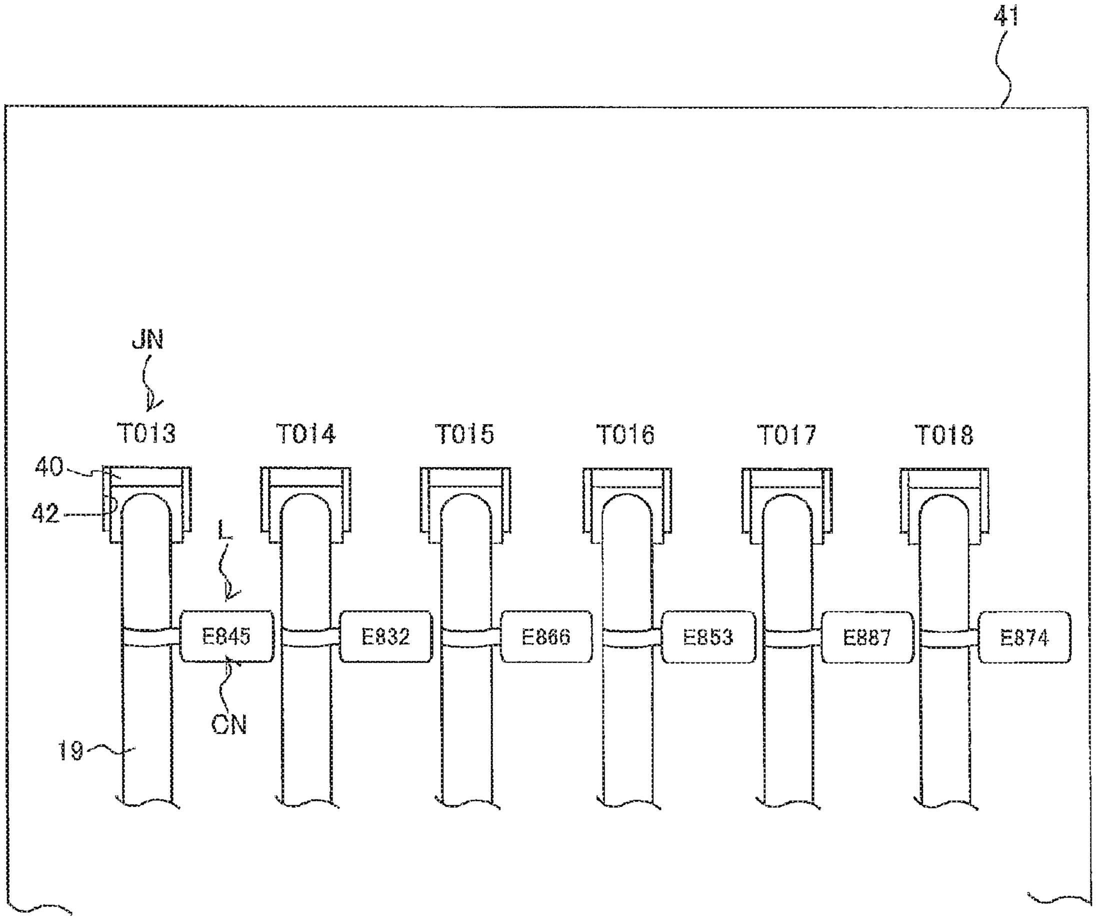
FIG. 8 is an explanatory diagram to for indicating jacks to which plugs that the printing labels are sticking to are inserted.

In an example illustrated in FIG. 8, jack numbers JN of each of six jacks 42 are "T013", "T014", "T015", "T016", "T017", and "T018" in the order from the left side of the drawing. In addition, the cable number CN of the cable 19 in which the plug 40 is plugged in the jack 42 represented by "jack number: T013" is "E845", the cable number CN of the cable 19 in which the plug 40 is plugged in the jack 42 represented by "jack number: T014" is "E832", the cable number CN of the cable 19 in which the plug 40 is plugged in the jack 42 represented by "jack number: T015" is "E866", the cable number CN of the cable 19 in which the plug 40 is plugged in the jack 42 represented by "jack number: T016" is "E853", the cable number CN of the cable 19 in which the plug 40 is plugged in the jack 42 represented by "jack number: T017" is "E887", and the cable number CN of the cable 19 in which the plug 40 is plugged in the jack 42 represented by "jack number: T018" is "E874".

In such a case, when the printing label L is prepared, it is extremely convenient insofar as the association between the cable 19 and the jack 42 can be clearly and self-explanatorily represented.

<Characteristics of this Embodiment>

In this embodiment, a plurality of cable numbers CN (corresponding to first data), which is the printing data, and a plurality of jack numbers JN (corresponding to second data) respectively corresponding to the plurality of cable numbers CN, are databased and stored in an HDD 306 of an operation terminal 300 as a database 310 such that the relation between the cable 19 and the jack 42 is represented. Furthermore, the database 310 may be stored in an external storing device different from the EEPROM 84 of the printing apparatus 1, or the operation terminal 300 and the printing apparatus 1.

Then, when the printing label L is prepared, in the printing apparatus 1, the plurality of cable numbers CN and the plurality of jack numbers JN are acquired from the database 310, and a plurality of printing label sets LC (refer to FIG. 11 described below), in which the cable number CN is printed in each of the label regions 16 and 17 of the label portion 95 and the jack number JN is printed in the non-label portion 96, are continuously generated. Accordingly, when the printing label L on which the cable number CN is printed is peeled off and is affixed to the cable 19, at the time of being used by the user, the affixing operation can be performed while performing visual confirmation, with reference to the jack number JN printed in the non-label portion 96. That is, the user can easily and correctly stick the printing label L representing the cable number CN corresponding to the jack number JN to cable 19 connected to the jack 42 representing the jack number JN in the plurality of jacks 42. Hereinafter, the details will be described.

<Database>

The database 310 will be described with reference to FIG. 9.

In FIG. 9, the plurality of cable numbers CN, and the plurality of jack numbers JN respectively corresponding to the plurality of cable numbers CN are stored in the database 310. In the example illustrated in FIG. 9, a "cable number" field and a "jack number" field are provided in the database 310, and a record of "cable number: E845" and "jack number: T013", a record of "cable number: E832" and "jack number: T014", a record of "cable number: E866" and "jack number: T015", a record of "cable number: E853" and "jack number: T016", a record of "cable number: E887" and "jack number: T017", and a record of "cable number: E874" and "jack number: T018" are provided corresponding to the cable number CN and the jack number JN illustrated in FIG. 8 described above.

In this embodiment, according to the operation of an operation unit 302 on the operation terminal 300 side by the user, the label preparation instruction signal including a plurality of records (the cable number CN and the jack number JN) of the database 310 is transmitted to the printing apparatus 1, and is received in the printing apparatus 1.

<Template>

In addition, in this embodiment, when the printing label L is prepared, in the printing apparatus 1, a template is set by being read out from the EEPROM 84 (or may be the ROM 83). Furthermore, the template may be stored in the HDD 306 of the operation terminal 300. The template set in this embodiment will be described with reference to FIG. 10. Furthermore, in FIG. 10, for the sake of facilitating the understanding, the printing tape 50 is illustrated by a dashed and dotted line.

Figure 10:
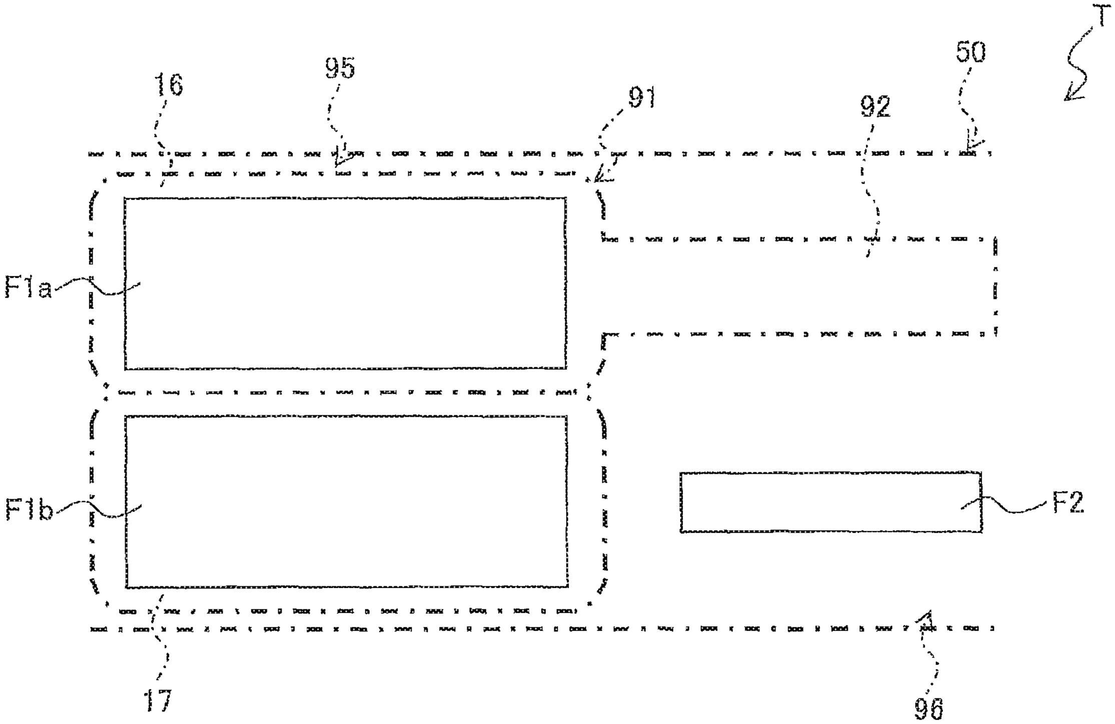
FIG. 10 is an explanatory diagram to explain a configuration of a template.

In FIG. 10, in a template T set in this embodiment, two input frames F1*a* and F1*b* for the cable number CN (corresponding to a first input frame), and a input frame F2 for the jack number JN (corresponding to a second input frame) are arranged. The input frame F1*a* is disposed in a position corresponding to the first label region 16, the input frame F1*b* is disposed in a position corresponding to the second label region 17, and the input frame F2 is disposed in a position corresponding to the portion on the downstream side (the right side in the drawing) of the second label region 17 in the conveying direction, which is closer to the second label region 17 to the first label region 16 in the non-label portion 96. Furthermore, the position of the input frame F2 is not limited to the above description, and may be other positions (for example, positions corresponding to the portion on the downstream side of the first label region 16 in the conveying direction in the non-label portion 96 and the portion on one side (the upper side in the drawing) of the winding portion 92 in the widthwise direction of tape).

<Database Printing>

Then, in this embodiment, in the printing apparatus 1, the data (the cable number CN and the jack number JN) of the record of the database 310 flows into the input frames F1*a*, F1*b*, and F2 of the template T, and the database is printed. That is, the cable number CN is assigned to each of the input frames F1*a* and F1*b*, and the jack number JN is assigned to the input frame F2. Then, the cable number CN is printed in a position designated by each of the input frames F1*a* and F1*b* of the printing tape 50, and the jack number JN corresponding to the cable number CN is printed in a position designated by the input frame F2. At this time, the text of the cable number CN is printed in a position designated by the input frame F1*a* at the upright posture along the conveying direction. The text of the same cable number CN is printed in a position designated by the input frame F1*b* at the inverted posture along the conveying direction. The text of the jack number JN corresponding to the cable number CN is printed in the position designated by the input frame F2 at the upright posture along the conveying direction. Accordingly, the plurality of printing label sets LC are continuously generated.

<External Appearance of Printing Tape after Database is Printed>

Figure 11:
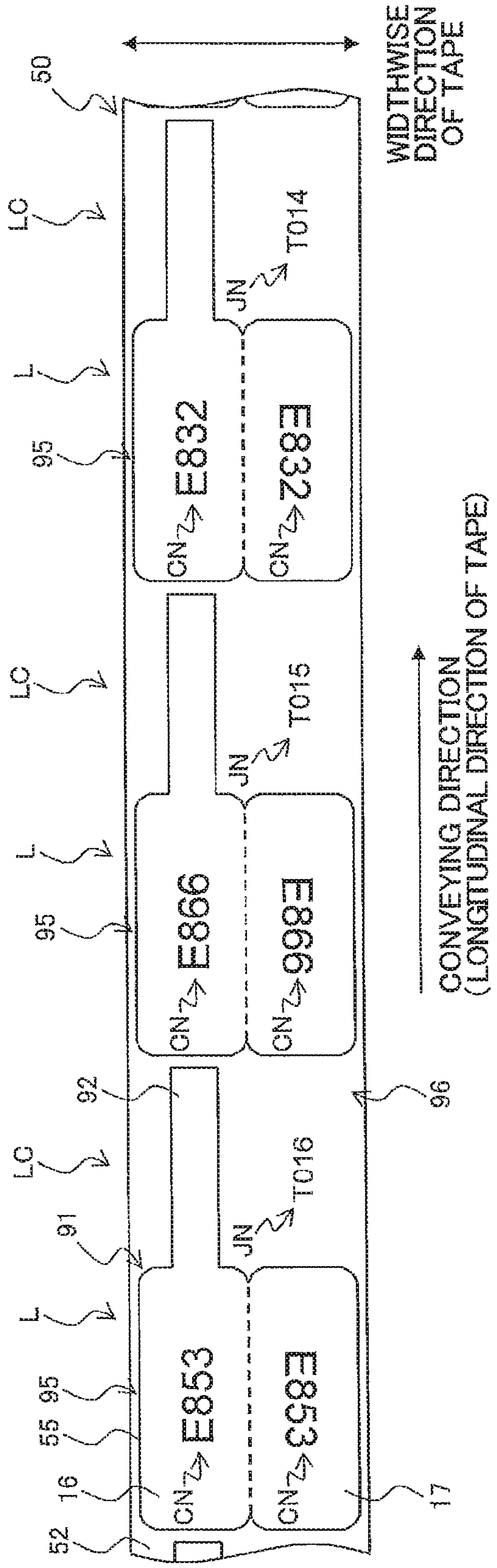
FIG. 11 is a plan view of an exterior of the printing tape to which the database has been printed.

FIG. 11 illustrates a plan view of the printing tape 50 after the database is printed.

In FIG. 11, the database is printed by using the template T and the database 310, and thus, the plurality of printing label sets LC are continuously generated in the printing tape 50.

Each of the printing label sets LC includes the printing label L including the label main body portion 91 in which the cable number CN is printed and the winding portion 92 as a unit, and the printing of the jack number JN printed in the non-label portion 96. In each of the printing label sets LC, the cable number CN is printed in each of the label regions 16 and 17, and the jack number JN corresponding to the cable number CN is printed in the portion on the downstream side of the second label region 17 in the conveying direction in the non-label portion 96. At this time, the text of the cable number CN on the first label region 16 side is printed at the upright posture along the conveying direction. The text of the cable number CN on the second label region 17 side is printed at the inverted posture along the conveying direction. The text of the jack number JN is printed at the upright posture along the conveying direction.

In an example illustrated in FIG. 11, a portion of the printing tape 50 is illustrated in which the printing label set LC where "E832" is printed in each of the label regions 16 and 17 as the cable number CN, and "T014" is printed in the non-label portion 96 as the jack number JN, corresponding to the record of "cable number: E832" and "jack number: T014", the printing label set LC where "E866" is printed in each of the label regions 16 and 17 as the cable number CN, and "T015" is printed in the non-label portion 96 as the jack number JN, corresponding to the next record of "cable number: E866" and "jack number: T015", and the printing label set LC where "E853" is printed in each of the label regions 16 and 17 as the cable number CN, and "T016" is printed in the non-label portion 96 as the jack number JN, corresponding to the next record of "cable number: E853" and "jack number: T016", are continuously generated.

<Control Procedure>

Hereinafter, in order to realize the method described above, a control procedure executed by the CPU 82 of the printing apparatus 1 will be described with reference to FIG. 12.

In FIG. 12, processing illustrated in the flowchart, for example, is started when a power source of the printing apparatus 1 is turned on.

First, in Step S10, the CPU 82 receives the label preparation instruction signal including the record (the cable number CN and the jack number JN) of a plurality of databases 310 (not limited to all of the databases, but may be a plurality of databases designated by the user) which are transmitted from the operation terminal 300. Furthermore, the CPU 82 executing Step S10 functions as an acquisition portion of claims.

After that, in Step S20, the CPU 82, for example, sets the template T by reading out template T from the EEPROM 84. Furthermore, the CPU 82 executing Step S20 functions as a setting unit of claims.

Then, in Step S25, the CPU 82 assigns the cable number CN to the input frames F1*a* and F1*b* of the template T set in Step S20, and assigns the jack number JN to the input frame F2 of the template T.

After that, in Step S30, the CPU 82 controls a drive motor 66 through a motor drive circuit 62, and starts the driving of a feeding roller drive shaft 23 and a ribbon winding shaft 29. The CPU 82 then starts the transport of the printing tape 50.

Then, in Step S40, the CPU 82 initializes the value of a counter variable N corresponding to the number of the record of the database 310 to 1.

After that, in Step S50, the CPU 82 acquires the record (the cable number CN and the jack number JN) of the number corresponding to the value of the counter variable N at this time point, in the plurality of records of the database 310 included in the label preparation instruction signal which is received in Step S10 described above.

Then, in Step S60, the CPU 82 determines whether or not the conveyed position of the printing tape 50 reaches a printing start position of the jack number JN on the basis of the position designated by the input frame F2. The determination of Step S60 is not satisfied (S60: NO) until the conveyed position of the printing tape 50 reaches the printing start position of the jack number JN, and a loop is on standby. In a case where the conveyed position of the printing tape 50 reaches the printing start position of the jack number JN, the determination of Step S60 is satisfied (S60: YES), and thus, the process returns to Step S70.

In Step S70, the CPU 82 controls the thermal head 22 through the thermal head drive circuit 61 on the basis of the jack number JN acquired in Step S50 described above, and prints the text of the jack number JN in the position designated by the input frame F2 of the printing tape 50 at the upright posture along the conveying direction.

After that, in Step S80, the CPU 82 determines whether or not the conveyed position of the printing tape 50 reaches a printing start position of the cable number CN on the basis of the position designated by the input frames F1*a* and F1*b*. The determination of Step S80 is not satisfied (S80: NO) until the conveyed position of the printing tape 50 reaches the printing start position of the cable number CN, a loop is on standby. In a case where the conveyed position of the printing tape 50 reaches the printing start position of the cable number CN, the determination of Step S80 is satisfied (S80: YES), and thus, the process returns to Step S90.

In Step S90, the CPU 82 controls the thermal head 22 through the thermal head drive circuit 61 on the basis of the cable number CN acquired in Step S50 described above, and prints the text of the cable number CN in the position of the printing tape 50 designated by the input frame F1*a* at the upright posture along the conveying direction, and prints the text of the cable number CN in the position designated by the input frame F1*b* at the inverted posture along the conveying direction. The printing label set LC in the printing tape 50 is generated by the printing in Step S70 described above and by the printing in Step S90 described above.

Then, in Step S100, the CPU 82 determines whether or not the value of the counter variable N at this time point is identical to the number of records K of the database 310 included in the label preparation instruction signal which is received in Step S10 described above. In a case where N=K is not satisfied, the determination of Step S100 is not satisfied (S100: NO), and the process proceeds to Step S110.

In Step S110, the CPU 82 adds 1 to the value of the counter variable N. Then, the process returns to Step S50 described above, and the procedure is repeated.

On the other hand, in Step S100 described above, in a case where N=K is satisfied, the determination of Step S100 is satisfied (S100: YES), and the process proceeds to Step S120.

In Step S120, the CPU 82 determines whether or not the conveyed position of the printing tape 50 reaches a predetermined cut position. The determination of Step S120 is not satisfied until the conveyed position of the printing tape 50 reaches the cut position (S120: NO), a loop is on standby, and in a case where the conveyed position of the printing tape 50 reaches the cut position, the determination of Step S120 is satisfied (S120: YES), and the process proceeds to Step S130.

In Step S130, the CPU 82 controls the drive motor 66 through the motor drive circuit 62, stops the driving of the feeding roller drive shaft 23 and the ribbon winding shaft 29, and stops the conveyance of the printing tape 50.

After that, in Step S140, the CPU 82 outputs a display signal to a display unit 64, and displays the effect that it is in a state where the printing tape 50 can be cut by operating a cutter button. As described above, the processing in the flowchart is ended. In a case where the user operates the cutter button according to the display described above, a cutter is operated, and the printing tape 50 is cut. The portion where the plurality of printing label sets LC are continuously generated is separated from the printing tape 50 by the cutting.

Here, the cable number CN and jack number JN in Steps S50-S90 performed at a certain point of timing correspond to one of the first data and one of the second data, respectively; the label portion 95 on which the cable number CN is printed corresponds to a first label portion; and the printing label set LC on which the cable number CN and jack number JN are printed corresponds to a first printing label set. Further, the cable number CN and jack number JN in Steps S50-S90 performed at a next timing of the above certain point correspond to remaining one of the first data and remaining one of the second data, respectively; the label portion 95 on which the cable number CN is printed corresponds to a second label portion; and the printing label set LC on which the cable number CN and jack number JN are printed corresponds to a second printing label set.

<Effect of First Embodiment>

As described above, in this embodiment, the plurality of cable numbers CN, and the plurality of jack numbers JN respectively corresponding to the plurality of cable numbers CN are databased such that the relationship between the cable 19 and the jack 42 is represented. Then, the plurality of cable numbers CN and the plurality of jack numbers JN are acquired, the cable number CN is printed in each of the label regions 16 and 17, and the jack number JN is printed in the non-label portion 96.

Accordingly, when the printing label L (in which the cable number CN is printed) is peeled off and is affixed to the cable 19 at the time of being used, the affixing operation can be performed while performing the visual confirmation, with reference to the jack number JN printed in the non-label portion 96. That is, in the plurality of jacks 42, the printing label L representing the cable number CN corresponding to the jack number JN can be easily and correctly affixed to the cable 19 connected to the jack 42 representing the jack number JN.

As described above, in this embodiment, the association between each of the cables 19 to which each of the printing labels L is affixed and the jack 42 can be visually obvious, and thus, the usability for the user can be improved.

In addition, in this embodiment, in particular, the template T is set in which the input frames F1*a*, F1*b*, and F2 are arranged, the cable number CN is allocated to each of the input frames F1*a* and F1*b* of the template T, and the jack number JN is allocated to the input frame F2 of the template T, and thus, the plurality of printing label sets LC are generated. Accordingly, in the database printing, the association between the cable 19 to which each of the printing labels L is affixed and the jack 42 can be obvious.

<Modification of First Embodiment>

The first embodiment is not limited to the above description and various modifications may be made therein without departing from the spirit and scope of the above described embodiment. Following describe such modifications.

(1) Case of Printing Forward Jack Number Next to Forward Cable Number

In the first embodiment described above, in the printing label set LC, a printing direction of the jack number JN in the non-label portion 96 is not coincident with a printing direction of the cable number CN in an immediately close region (the second label region 17) of the label portion 95, but is not limited thereto.

Figure 13:
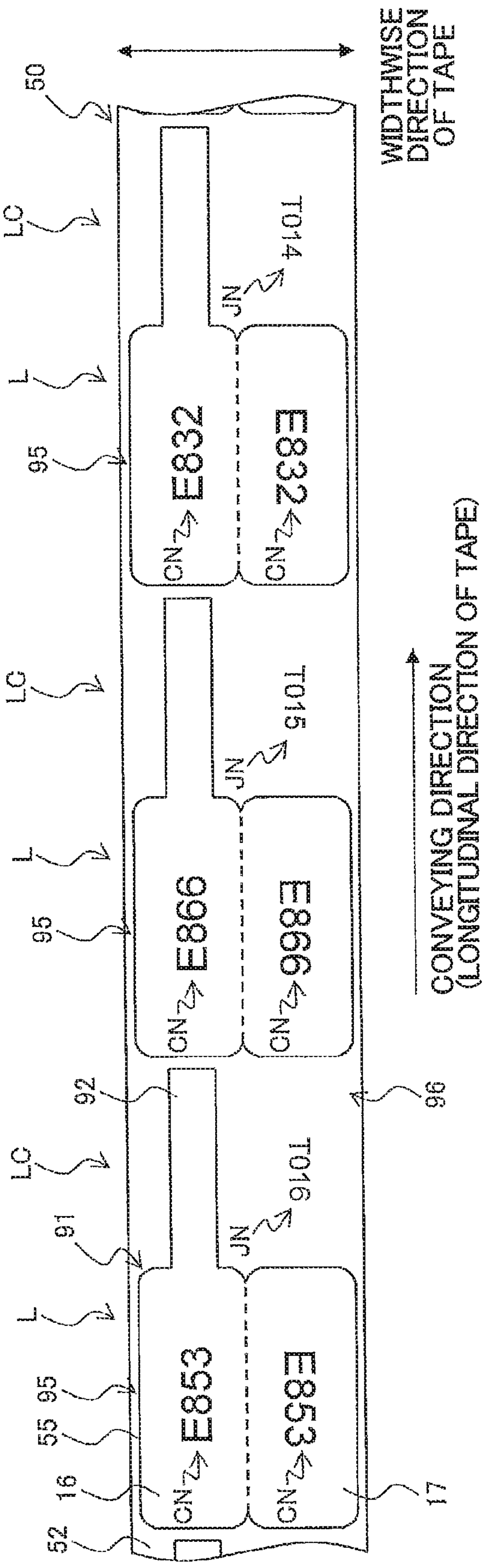
FIG. 13 is a plan view of a printing tape to which a database has been printed according to a modification in which forward-direction jack numbers are printed beside forward-direction cable numbers.

In this modification example, as illustrated in FIG. 13, the CPU 82 prints the database by using the template T and the database 310, and thus, as with the first embodiment described above, the plurality of printing label sets LC are generated in which the cable number CN is printed in each of the label regions 16 and 17. The jack number JN corresponding to the cable number CN is printed in the portion on the downstream side of the second label region 17 in the conveying direction in the non-label portion 96. The printing direction of the cable number CN in each of the label regions 16 and 17 is identical to that in the first embodiment described above. The text of the jack number JN is printed at the inverted posture along the conveying direction. Furthermore, in this modification example, the second label region 17 corresponds to the portion on one side, the label region 16 corresponds to the portion on the other side, the printing direction of the cable number CN in the second label region 17 corresponds to a forward direction, and the printing direction of the cable number CN in the first label region 16 corresponds to a reverse direction. That is, in this modification example, in the printing label set LC, the printing direction of the jack number JN in the non-label portion 96 is coincident with the printing direction of the cable number CN in the immediately close region (the second label region 17) of the label portion 95.

In this modification example, the same effect as that in the first embodiment described above is obtained. In addition, according to this modification example, in the printing label set LC, the printing direction of the jack number JN in the non-label portion 96 is coincident with the printing direction of the cable number CN in the adjacent region to the label portion 95, and thus, the relationship between each of the cables 19 to which each of the printing labels L is affixed and the jack 42 can be more clear.

(2) Case of Printing Figure for Association in Non-Label Portion

Figure 14:
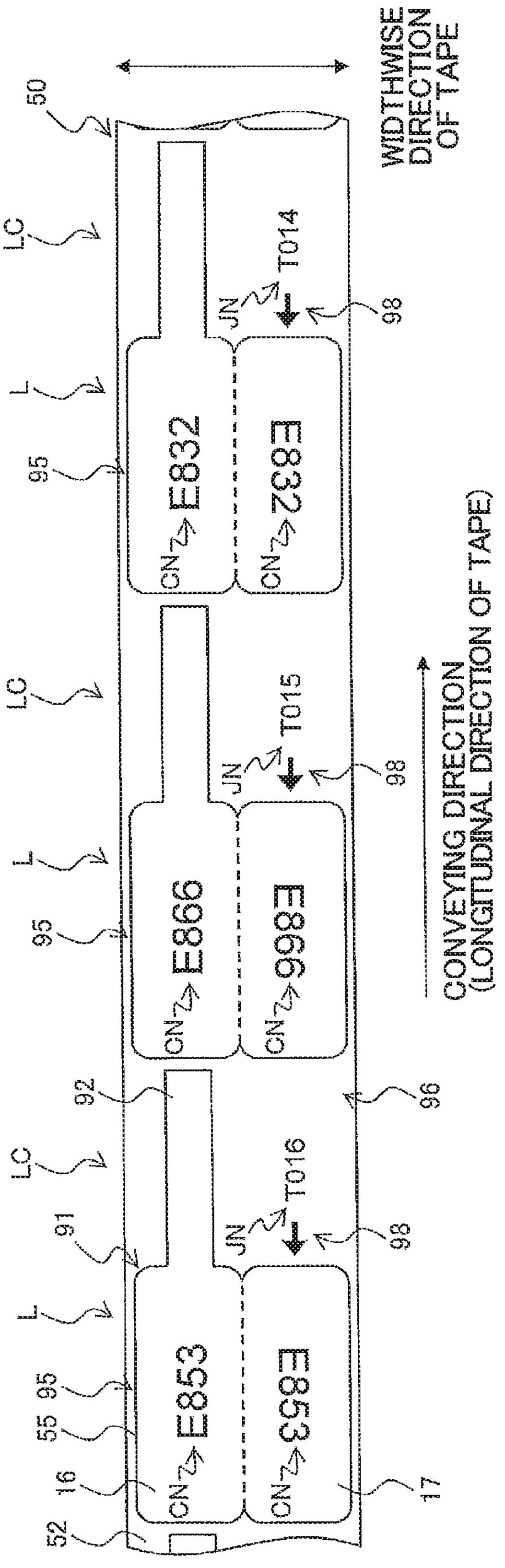
FIG. 14 is a plan view of an exterior of the printing tape to which a database has been printed according to a modification in which correlating figures are printed on the non-label portion.

In this modification example, as illustrated in FIG. 14, the database is printed by using a template (not illustrated) of this modification example and the database 310, and thus, the CPU 82 generates the plurality of printing label sets LC. In the label set LC, the cable number CN is printed in each of the label regions 16 and 17, and the jack number JN corresponding to the cable number CN is printed in the portion on the downstream side of the second label region 17 in the conveying direction in the non-label portion 96, and an arrow 98 of a shape indicating the upstream side (the left side in the drawing, in other words, the direction of the label portion 95) in the conveying direction is printed in an intermediate portion between the second label region 17 and the printing of the jack number JN in the non-label portion 96, as a figure for correlating the printing of the cable number CN with the printing of the jack number JN. The printing direction of the cable number CN and the printing direction of the jack number JN in each of the label regions 16 and 17 are respectively identical to those in the first embodiment described above. Furthermore, the position and the shape of the arrow 98 are not limited to the above description, and may be other positions and shapes. In addition, a figure (for example, a broken line) having a shape other than the arrow 98 may be printed as the figure described above.

Even in this modification example, the same effect as that in the first embodiment described above is obtained. In addition, according to this modification example, in the printing label set LC, the arrow 98 associating the printing of the cable number CN with the printing of the jack number JN is printed, and thus, the association between each of the cables 19 to which each of the printing labels L is affixed and the jack 42 can be more obvious.

(3) Case of Printing QR Code in Non-Label Portion

A database of this modification example will be described with reference to FIG. 15.

In FIG. 15, in a database 310A of this modification example, a "processing" field is provided, in addition to the "cable number" field and the "jack number" field described above. In the "processing" field of each record, a character of "unprocessed" representing a state of being unprocessed is allocated until predetermined processing (described below) is performed, and in a case where the predetermined processing is performed, a character of "processed" representing a state of being processed is allocated (The character of "unprocessed" is changed to the character of "processed").

Figure 16:
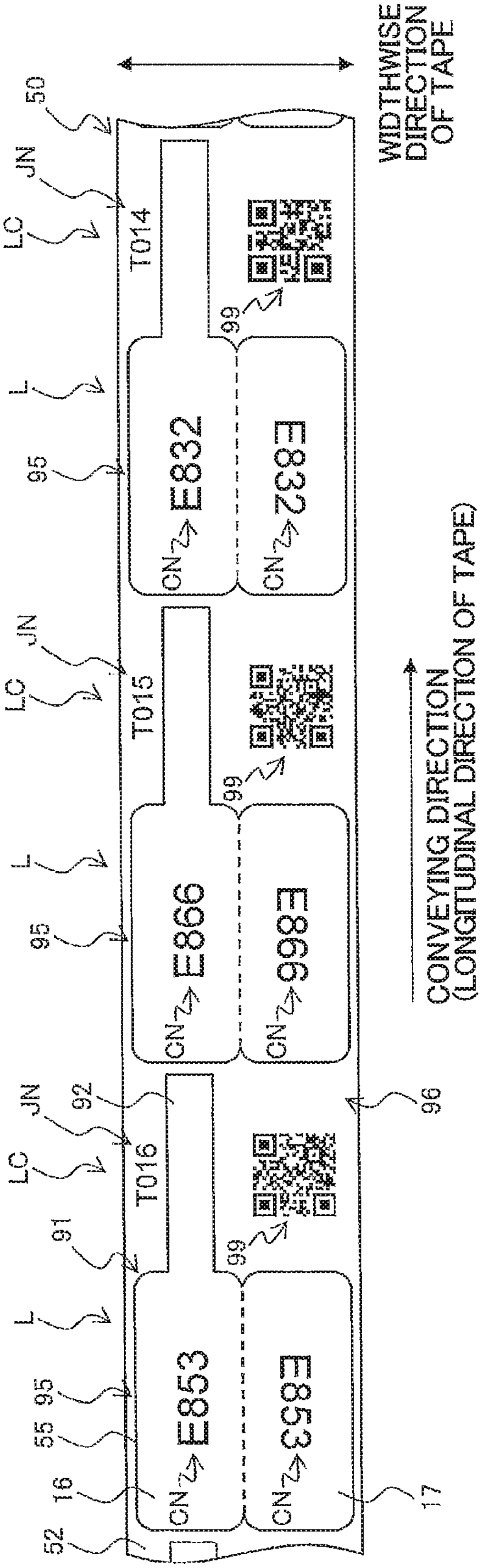
FIG. 16 is a plan view of an exterior of the printing tape to which the database has been printed.

Then, in this modification example, as illustrated in FIG. 16, the database is printed by using the template (not illustrated) of this modification example and the database 310A, and thus, the CPU 82 generates the plurality of printing label sets LC in which the cable number CN is printed in each of the label regions 16 and 17, jack number JN corresponding to the cable number CN is printed in the portion on the downstream side (the right side in the drawing) of the first label region 16 in the conveying direction, which is closer to the first label region 16 than to the second label region 17, and on the one side (the upper side in the drawing) of the winding portion 92 in the widthwise direction of tape in the non-label portion 96, and a QR code 99 generated in accordance with the cable number CN (or may be the jack number JN) is printed in the portion on the downstream side second label region 17 in the conveying direction in the non-label portion 96. The printing direction of the cable number CN in each of the label regions 16 and 17 is identical to that in the embodiment described above. The text of the jack number JN is printed at the upright posture along the conveying direction. Furthermore, in this modification example, the first label region 16 corresponds to the portion on one side, the second label region 17 corresponds to the portion on the other side, the printing direction of the cable number CN in the first label region 16 corresponds to forward direction, and the printing direction of the cable number CN in the second label region 17 corresponds to reverse direction. Furthermore, the position and the printing direction of the jack number JN are not limited to the above description, and may be other positions (for example, an upper side or a lower side of the QR code 99 in the drawing) and printing directions. In addition, the position of the QR code 99 is not limited to the above description, and may be other positions. In addition, a two dimensional code or one dimensional code in other formats may be printed instead of the QR code 99.

Then, as described above, in a case where the user sticks the printing label L representing the cable number CN ("E832") corresponding to the jack number JN ("T014") to the cable 19 connected to the jack 42 represented by the jack number JN (for example, "T014"), and then, reads the corresponding QR code 99 with a suitable terminal (not illustrated, and for example, a portable terminal in which a predetermined application program is installed), the character of "unprocessed" in the "processing" field of the record including the cable number CN ("E832") of the database 310A is changed to the character of "processed" (refer to FIG. 15).

Even in this modification example, the same effect as the in the first embodiment described above is obtained.

<Modification of First Embodiment>

Following describes the second embodiment of the disclosure. In the second embodiment, the same reference numerals are given to the same parts as in the first embodiment, and a detailed description thereof will be omitted or simplified as needed.

<Structure of Printing Tape>

The structure of the printing tape used in this embodiment will be described with reference to FIG. 17.

Figure 17:
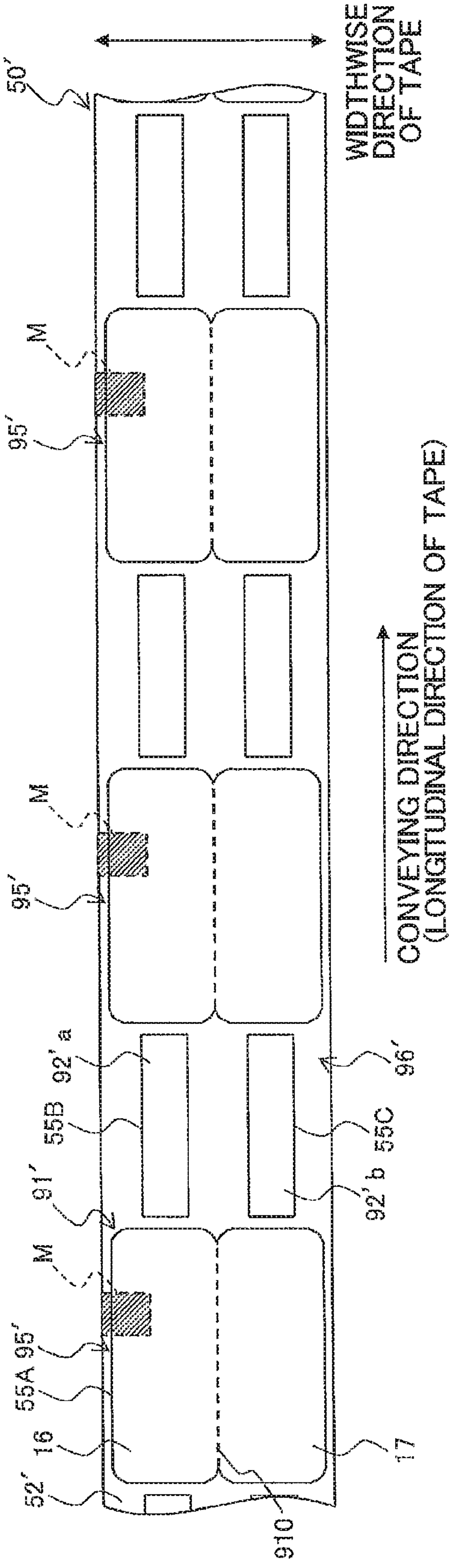
FIG. 17 is a plan view of an exterior of a printing tape according to a second embodiment of the present disclosure.

In FIG. 17, as with the printing tape 50, a printing tape 50' (corresponding to the tape) used in this embodiment is configured by peelably sticking an elongated-rectangular shaped adhesive sheet 52' (corresponding to the second sheet) including the base material **52*b* on the front side and the adhesive layer 52*a* on the rear side, to the front surface Ma of the peeling sheet 54**.

As illustrated in FIG. 17, insertions 55A, 55B, and 55C, which are in the shape for preparing a label portion and are formed by the half cutting processing, are formed in the printing tape 50' to respectively surround a predetermined region. Accordingly, an inner portion of a region of the adhesive sheet 52', which is surrounded by the cut line 55A, is a label main body portion 91', an inner portion of a region, which is surrounded by the cut line 55B, is a winding portion **92'*a*, and an inner portion of a region, which is surrounded by the cut line 55C, is a winding portion 92'*b*, a label portion 95' is configured of the label main body portion 91' and the winding portions 92'*a* and 92*b*, and a portion other than the label portion 95' (an outer portion of each of the regions) is a non-label portion 96'. In the printing tape 50', a plurality of label portions 95'** are arranged at predetermined intervals along the conveying direction.

In addition, as with the first embodiment described above, on the rear surface of the peeling sheet 54, the plurality of sensor marks M are formed in advance by printing at predetermined intervals (identical to the interval between the label portions 95') along the conveying direction.

Each of the label portions 95' includes the label main body portion 91', and the winding portions **92'*a* and 92'*b* provided separately from the label main body portion 91'. Furthermore, one or three or more winding portions may be provided in each of the label portions 95'**.

The label main body portion 91' has the same configuration as that of the label main body portion 91, and includes the perforation 910 in the approximately central portion in the widthwise direction of tape, the first label region 16 on one side (the upper side in the drawing) from the perforation 910 in the widthwise direction of tape, and the second label region 17 on the other side (the lower side in the drawing) from the perforation 910 in the widthwise direction of tape.

Each of the winding portions **92'*a* and 92'*b* is provided on the downstream side (the right side in the drawing) of the label regions 16 and 17 in the conveying direction, and as with the winding portion 92**, has substantially a horizontal rectangular shape.

<Template>

A template set in this embodiment will be described with reference to FIG. 18. Furthermore, in FIG. 18, for the sake of facilitating the understanding, the printing tape 50' is illustrated by a dashed and dotted line.

Figure 18:
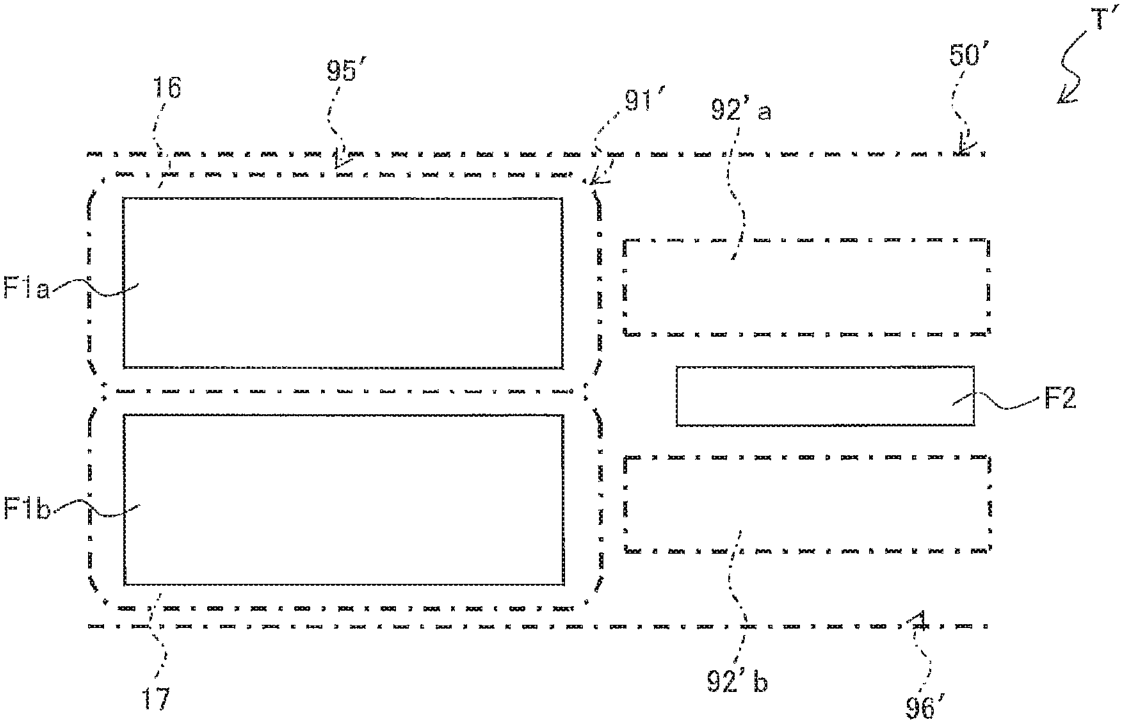
FIG. 18 is an explanatory view for explaining a configuration of a template.

In FIG. 18, in a template T' set in this embodiment, as with the template T, the input frames F**1*a*, F1*b*, and F2 are arranged. As with the first embodiment described above, the input frame F1*a* is disposed in a position corresponding to the first label region 16, and the input frame F1*b* is disposed in a position corresponding to the second label region 17. The input frame F2 is disposed in a position which is on the downstream side (the right side in the drawing) of the label main body portion 91' in the conveying direction and corresponds to a portion between the winding portions 92'*a* and 92*b*, in the non-label portion 96'. Furthermore, the position of the input frame F2 is not limited to the above description, and may be other positions (for example, a portion which is on the downstream side of the first label region 16 in the conveying direction and is on one side (the upper side in the drawing) of the winding portion 92'*a* in the widthwise direction of tape in the non-label portion 96', and a portion which is on the downstream side of the second label region 17 in the conveying direction and is on the other side (the lower side in the drawing) of the winding portion 92'*b* in the widthwise direction of tape in the non-label portion 96'). In addition, the position of the input frame F2 may be a position corresponding to the winding portion 92'*a* or the winding portion 92*b***.

<Database Printing>

Then, in this embodiment, as with the first embodiment described above, in the printing apparatus 1, the data of the record of the database 310 flows into the input frames F**1*a*, F1*b*, and F2 of the template T', and the database printing is performed. That is, the CPU 82** assigns the cable number CN to each of the input frames F1*a* and F1*b*, and assigns the jack number JN to the input frame F2. Then, the CPU 82 prints the cable number CN in the position designated by each of the input frames F1*a* and F1*b* of the printing tape 50', and prints the jack number JN corresponding to the cable number CN in the position designated by the input frame F2. Accordingly, the CPU 82 continuously generates a plurality of printing label sets LC' (refer to FIG. 19 described below).

<External Appearance of Printing Tape after Database is Printed>

Figure 19:
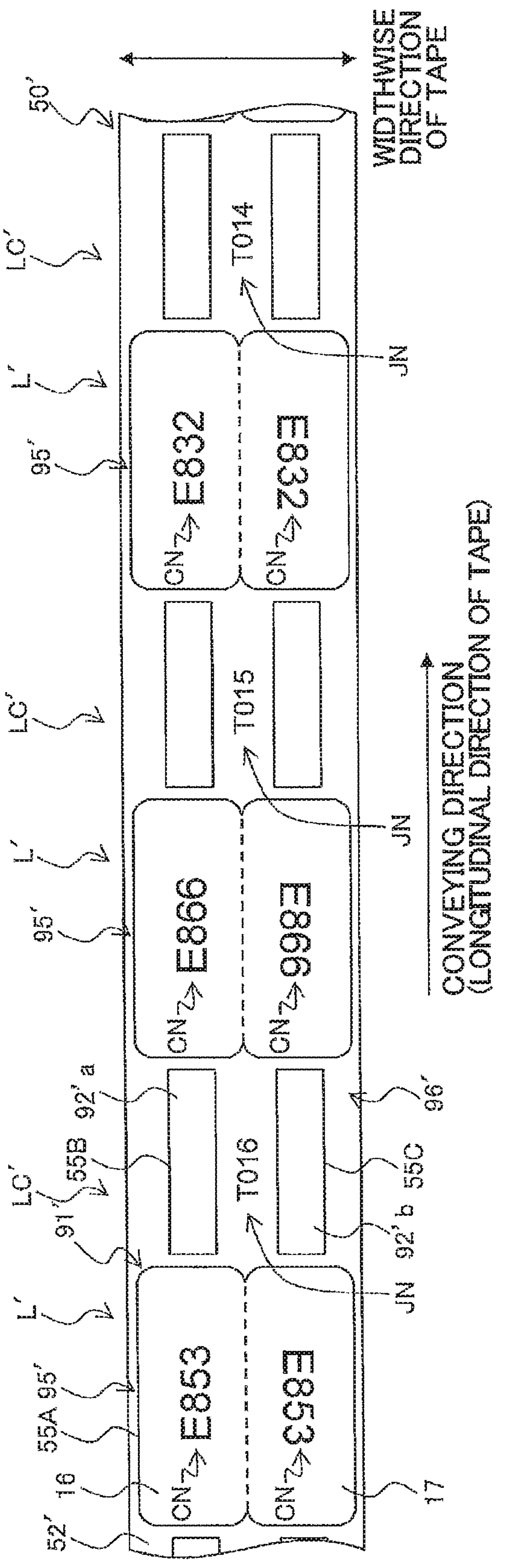
FIG. 19 is a plan view of an exterior of the printing tape to which a database has been printed.

FIG. 19 illustrates a plan view of the printing tape 50' after the database is printed.

In FIG. 19, the database is printed by using the template T' and the database 310, and thus, the plurality of printing label sets LC' are continuously generated in the printing tape 50'.

Each of the printing label sets LC' includes the printing label L' separately including the label main body portion 91' in which the cable number CN is printed and the winding portions 92'*a* and 92*b*, and the printing of the jack number JN printed in the non-label portion 96'. In each of the printing label sets LC', the cable number CN is printed in each of the label regions 16 and 17, and the jack number JN corresponding to the cable number CN is printed in the portion which is on the downstream side of the label main body portion 91' in the conveying direction and is between the winding portions 92'*a* and 92'*b*, in the non-label portion 96'. At this time, the text of the cable number CN on the first label region 16 side is printed at the upright posture along the conveying direction. The text of the cable number CN on the second label region 17 side is printed at the inverted posture rotated by 180° (degrees) along the conveying direction. The text of the jack number JN is printed at the upright posture along the conveying direction.

In an example illustrated in FIG. 19, a portion of the printing tape 50A is illustrated in which the printing label set LC' where "E832" is printed in each of the label regions 16 and 17 as the cable number CN, and "T014" is printed in the non-label portion 96' as the jack number JN, corresponding to the record of "cable number: E832" and "jack number: T014", the printing label set LC' where "E866" is printed in each of the label regions 16 and 17 as the cable number CN, and "T015" is printed in the non-label portion 96' as the jack number JN, corresponding to the next record of "cable number: E866" and "jack number: T015", and the printing label set LC' where "E853" is printed in each of the label regions 16 and 17 as the cable number CN, and "T016" is printed in the non-label portion 96' as the jack number JN, corresponding to the next record of "cable number: E853" and "jack number: T016", are continuously generated.

Here, the cable number CN and jack number JN performed at a certain point of timing correspond to one of the first data and one of the second data, respectively; the label portion 95' on which the cable number CN is printed corresponds to a first label portion; and the printing label set LC' on which the cable number CN and jack number JN are printed corresponds to a first printing label set. Further, the cable number CN and jack number JN performed at a next timing of the above certain point correspond to remaining one of the first data and remaining one of the second data, respectively; the label portion 95' on which the cable number CN is printed corresponds to a second label portion; and the printing label set LC' on which the cable number CN and jack number JN are printed corresponds to a second printing label set.

<Effect of Second Embodiment>

Even in this embodiment described above, as with the first embodiment described above, the association between each of the cables 19 to which each of the printing label L' is affixed and the jack 42 can be visually obvious, and the usability for the user can be improved.

The second embodiment is not limited to the above description and various modifications may be made therein without departing from the spirit and scope of the above described embodiment.

Following describes the third embodiment of the disclosure. In the third embodiment, the same reference numerals are given to the same parts as in the first embodiment, and a detailed description thereof will be omitted or simplified as needed.

<Structure of Printing Tape>

The structure of the printing tape used in this embodiment will be described with reference to FIG. 20.

Figure 20:
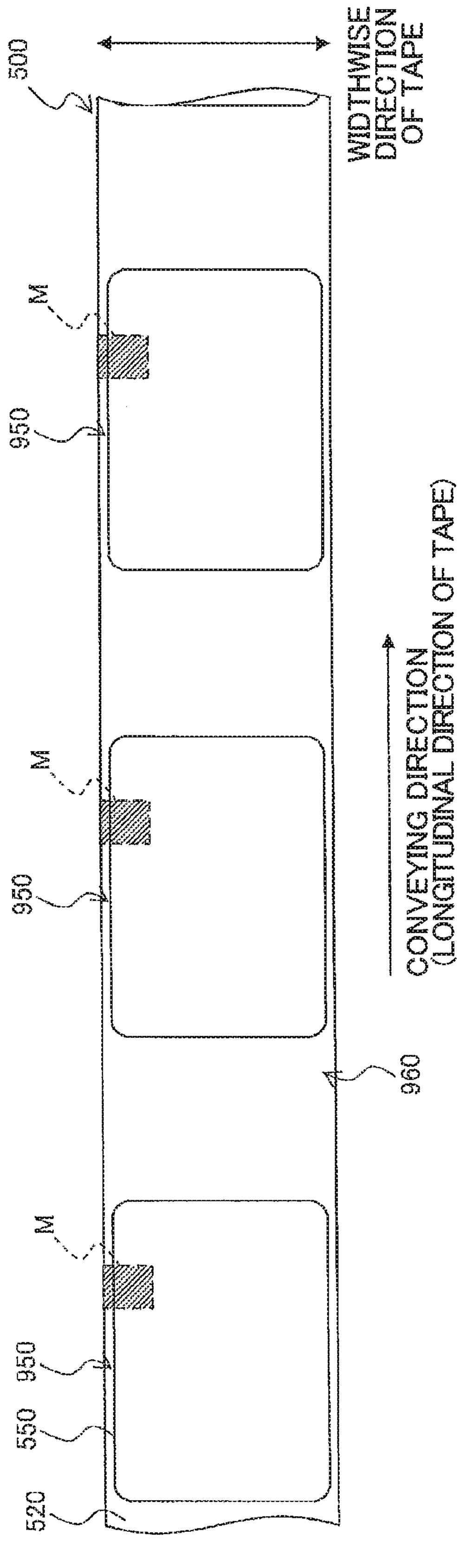
FIG. 20 is a plan view of an exterior of a printing tape before printing according to a third embodiment of the present disclosure.

In FIG. 20, a printing tape 500 (corresponding to the tape) used in this embodiment, as with the printing tape 50 described above, is configured by peelably sticking an elongated-rectangular shaped adhesive sheet 520 (corresponding to the second sheet) including a base material on the front side and an adhesive layer on the rear side to the front surface (corresponding to the first surface) of the elongated-rectangular shaped peeling sheet (not illustrated, corresponding to the first sheet).

As illustrated in FIG. 20, a cut line 550, which is in the shape for preparing a label portion and is formed by the half cutting processing, is formed in the printing tape 500 to surround a predetermined region. Accordingly, an inner portion of the region of the adhesive sheet 520 is a label portion 950, and a portion other than the label portion 950 (an outer portion of the region) is a non-label portion 960. In the printing tape 500, a plurality of label portions 950 are arranged at predetermined intervals along the conveying direction.

In addition, as with the first embodiment described above, on the rear surface of the peeling sheet, the plurality of sensor marks M are formed in advance by printing at predetermined intervals (identical to the interval between the label portions 950) along the conveying direction.

The label portion 950 has substantially a horizontal rectangular shape in which the conveying direction is set to the longitudinal direction, and the widthwise direction of tape is set to the transverse direction.

Printing of printing data planned to be represented in a printing label LL (refer to FIG. 21 described below) is performed with respect to each of the plurality of label portions 950 of the printing tape 500 having the configuration described above, by the thermal head 22, and thus, a plurality of printing labels LL are generated in which the printing data is printed in the label portion 950.

<Usage Pattern of Printing Label>

Only a desired printing label LL is peeled off from the peeling sheet along the cut line 550 while allowing the non-label portion 960 in the adhesive sheet 520 of the printing tape 500 to remain, at the time of being used by the user. The peeled printing label LL is affixed to a front surface of an envelope 190 for a direct mail, which is an adherend, through the adhesive layer on the rear surface.

<Problem>

However, there is a case where a plurality of envelopes 190 to which each of the plurality of printing label LL is affixed, are planned to be further associated with another material (hereinafter, suitably referred to as a "relevant material"). For example, as illustrated in FIG. 21, there is a case where the plurality of envelopes 190 to which each of the printing labels LL representing an address Ad and a name Na (hereinafter, suitably and collectively referred to as a "destination Ad and Na") is affixed, are planned to be respectively associated with a plurality of contents 420 (in this example, a catalog, and hereinafter, suitably referred to as a "catalog 420") in each of the plurality of envelopes 190.

Figure 21:
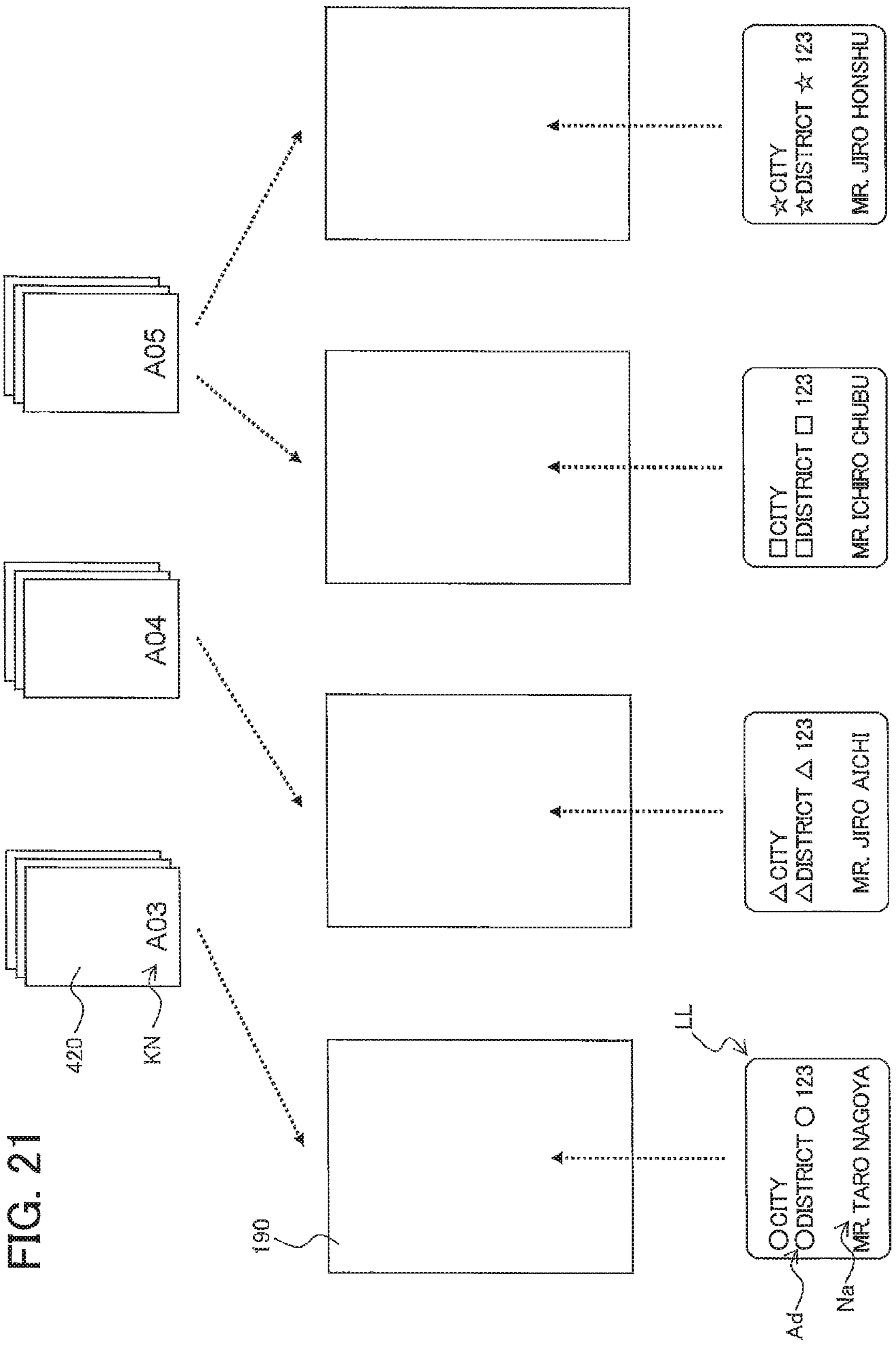
FIG. 21 is an explanatory view of envelopes to which printing labels indicating destinations can be affixed and catalogs that are enclosures of the envelopes.

In an example illustrated in FIG. 21, the catalog 420 in which a catalog number KN is "A03", the catalog 420 in which the catalog number KN is "A04", and the catalog 420 in which the catalog number KN is "A04" are prepared. Then, the catalog number KN of the catalog 420 in the envelope 190 to which the printing label LL representing "Address: ○ City ○ District ○ 123" and "Name: Mr. Taro NAGOYA" is affixed, is "A03"; the catalog number KN of the catalog 420 in the envelope 190 to which the printing label LL representing "Address: Δ City Δ District Δ 123" and "Name: Mr. Jiro AICHI" is affixed, is "A04"; the catalog number KN of the catalog 420 in the envelope 190 to which the printing label LL representing "Address: □ City □ District □ 123" and "Name: Mr. Ichiro CHUBU" is affixed, is "A05"; and the catalog number KN of the catalog 420 in the envelope 190 to which the printing label LL representing "Address: ☆ City ☆ District ☆ 123" and "Name: Mr. Jiro HONSHU" is affixed, is "A05".

In such a case, when the printing label LL is prepared, it is extremely convenient insofar as the association between the envelope 190 and the catalog 420, which is the contents of the envelope 190, can be clearly and self-explanatorily represented.

<Characteristics of this Embodiment>

In this embodiment, a plurality of destinations Ad and Na (corresponding to the first data), which are the printing data, and a plurality of catalog numbers KN (corresponding to the second data) respectively corresponding to the plurality of destinations Ad and Na are databased and stored in the HDD 306 of the operation terminal 300 as a database 3100 (refer to FIG. 22 described below) such that the association between the envelope 190 and the catalog 420, which is the contents of the envelope 190, is represented.

Then, when the printing label LL is prepared, in the printing apparatus 1, the plurality of destinations Ad and Na and the plurality of catalog numbers KN are acquired from the database 3100, and a plurality of printing label sets LLC (refer to FIG. 24 described below), in which the destination Ad and Na is printed in the label portion 950 and the catalog number KN is printed in the non-label portion 960, are continuously generated. Accordingly, the user can stick the printing label LL representing the destination Ad and Na to the envelope 190, and then, can insert the catalog 420 representing the catalog number KN corresponding to the destination Ad and Na without making mistakes. Hereinafter, the details will be described.

<Database>

The database 3100 will be described with reference to FIG. 22.

In FIG. 21, the plurality of destinations Ad and Na (the address Ad and the name Na), and the plurality of catalog numbers KN respectively corresponding to the plurality of destinations Ad and Na are stored database 3100. In the example illustrated in FIG. 22, an "address" field, a "name" field, and a "catalog number" field are provided in the database 3100; a record of "Address: ○ City ○ District ○ 123", "Name: Mr. Taro NAGOYA", and "Catalog Number: A03"; a record of "Address: Δ City Δ District Δ 123", "Name: Mr. Jiro AICHI", and "Catalog Number: A04", a record of "Address: □ City □ District □ 123", "Name: Mr. Ichiro CHUBU", and "Catalog Number: A05"; and a record of "Address: ☆ City ☆ District ☆ 123", "Name: Mr. Jiro HONSHU", and "Catalog Number: A05" are provided corresponding to the destination Ad and Na and the catalog number KN illustrated in FIG. 21 described above.

In this embodiment, according to the operation of the operation unit 302 on the operation terminal 300 side by the user, the label preparation instruction signal including a plurality of records (the destination Ad and Na and the catalog number KN) of the database 3100 is transmitted to the printing apparatus 1, and is received in the printing apparatus 1.

<Template>

In addition, in this embodiment, when the printing label LL is prepared, in the printing apparatus 1, a template is set by being read out from the EEPROM 84. The template set in this embodiment will be described with reference to FIG. 23. Furthermore, in FIG. 23, for the sake of facilitating the understanding, the printing tape 500 is illustrated by a dashed and dotted line.

Figure 23:
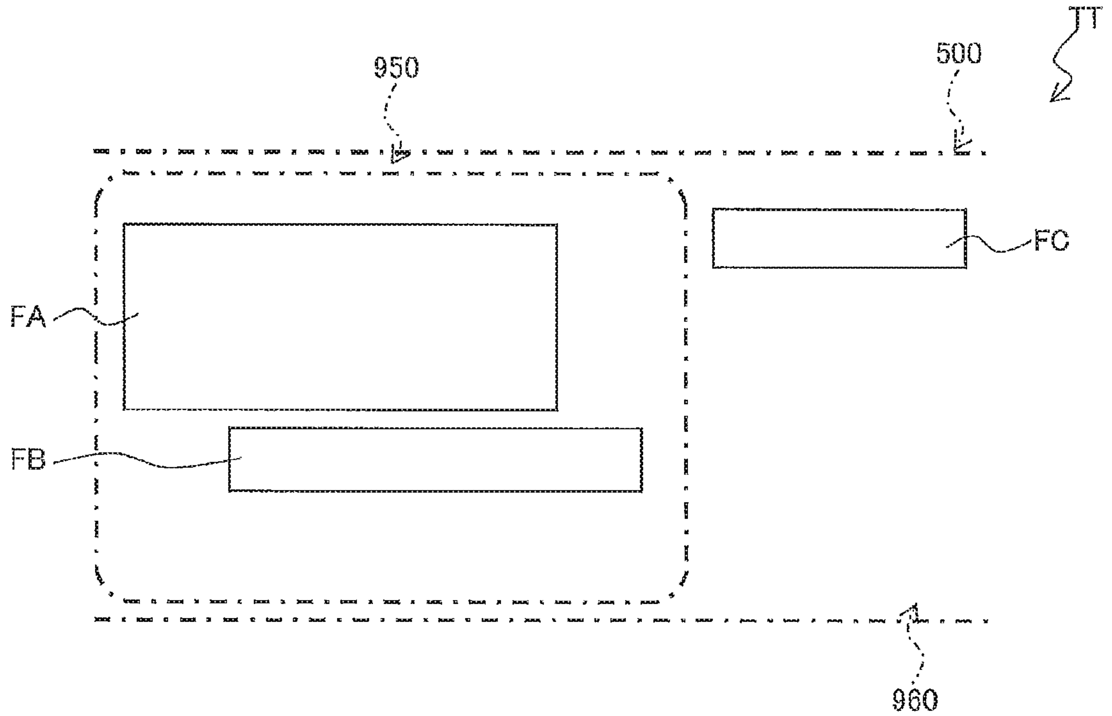
FIG. 23 is an explanatory view of a configuration of a template.

In FIG. 23, in a template TT set in this embodiment, an input frame FA for the address Ad, an input frame FB for the name Na, and an input frame FC for the catalog number KN (corresponding to the second input frame) are arranged. Furthermore, the input frames FA and FB correspond to the first input frame of claims. The input frame FA is disposed in a position corresponding to a portion on one side (the upper side in the drawing) of the label portion 950 in the widthwise direction of tape. The input frame FB is disposed in a position corresponding to a portion on the other side (the lower side in the drawing) of the input frame FA in the widthwise direction of tape in the label portion 950. The input frame FC is disposed in a position corresponding to a suitable portion on the downstream side (the right side in the drawing) from the label portion 950 in the conveying direction (in this example, in the vicinity of one end portion in the widthwise direction of tape) in the non-label portion 960.

<Database Printing>

Then, in this embodiment, in the printing apparatus 1, the data (the address Ad, the name Na, and the catalog number KN) of the record of the database 3100 flows into the input frames FA, FB, and FC of the template TT, and the database is printed. That is, the CPU 82 assigns the address Ad to the input frame FA, assigns the name Na to the input frame FB, and assigns the catalog number KN to the input frame FC. Then, the CPU 82 prints the address Ad in a position designated by the input frame FA of the printing tape 500, prints the name Na in a position designated by the input frame FB, and prints the catalog number KN corresponding to the destination Ad and Na in a position designated by the input frame FC. Accordingly, the CPU 82 continuously generates the plurality of printing label sets LLC.

<External Appearance of Printing Tape after Database is Printed>

Figure 24:
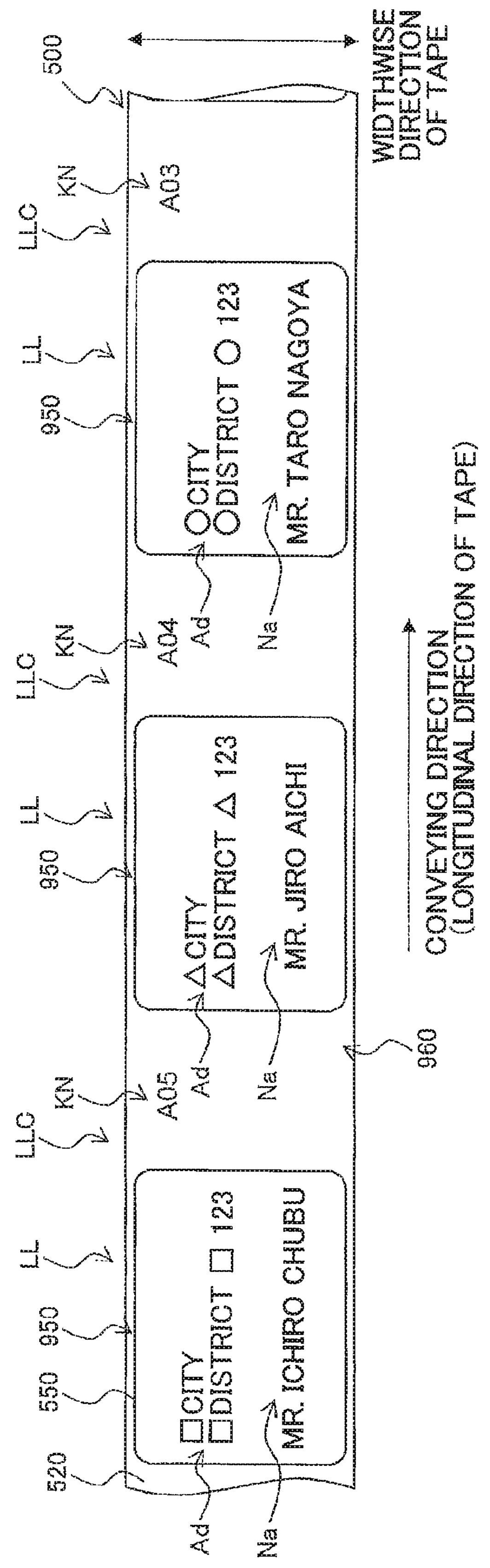
FIG. 24 is a plan view of the printing tape to which the database has been printed.

FIG. 24 illustrates a plan view of the printing tape 500 after the database is printed.

In FIG. 24, the database is printed by using the template TT and the database 3100, and thus, the plurality of printing label sets LLC are continuously generated in the printing tape 500.

Each of the printing label sets LLC includes the printing label LL formed of the label portion 950. In the label portion 950, the destination Ad and Na is printed, and the printing of the catalog number KN printed in the non-label portion 960. In each of the printing label sets LLC, the address Ad is printed in the portion on one side in the widthwise direction of tape in the label portion 950 at the upright posture along the conveying direction; the name Na is printed in the portion on the other side of the destination Ad in the widthwise direction of tape in the label portion 950 at the upright posture along the conveying direction; and the catalog number KN corresponding to the destination Ad and Na is printed in the vicinity of one end portion in the widthwise direction of tape, which is on the downstream side from the label portion 950 in the conveying direction in the non-label portion 960, at the upright posture along the conveying direction.

In the example illustrated in FIG. 24, a portion of the printing tape 500 is illustrated. In the printing tape 500, the printing label sets LLC are continuously generated. In one of the printing label sets LLC, "○ City ○ District ○ 123" is printed in the label portion 950 as the address Ad, "Mr. Taro NAGOYA" is printed in the label portion 950 as the name Na, and "A03" is printed in the non-label portion 960 as the catalog number KN, corresponding to the record of "Address: ○ City ○ District ○ 123", "Name: Mr. Taro NAGOYA", and "Catalog Number: A03". In one of the printing label sets LLC, "Δ City Δ District Δ 123" is printed in the label portion 950 as the address Ad, "Mr. Jiro AICHI" is printed in the label portion 950 as the name Na, non-label portion 960, and "A04" is printed in the label portion 950 as the catalog number KN, corresponding to the next record of "Address: Δ City Δ District Δ 123", "Name: Mr. Jiro AICHI", and "Catalog Number: A04". In one of the printing label sets LLC, "□ City □ District □ 123" is printed in the label portion 950 as the address Ad, "Mr. Ichiro CHUBU" is printed in the label portion 950 as the name Na, and "A05" is printed in the non-label portion 960 as the catalog number KN, corresponding to the next record of "Address: □ City □ District □ 123", "Name: Mr. Ichiro CHUBU", and "Catalog Number: A05".

<Effect of Third Embodiment>

According to this embodiment described above, the user can stick the printing label LL representing the destination Ad and Na to the envelope 190, and then, can insert the catalog 420 representing the catalog number KN corresponding to the destination Ad and Na without omission. Thus, in this embodiment, the relationship between each of the envelopes 190 to which each of the printing labels LL is affixed and the catalog 420 can be visually obvious, and the usability for the user can be improved.

Here, the destination Ad, Na and catalog number KN performed at a certain point of timing correspond to one of the first data and one of the second data, respectively; the label portion 950 on which the destination Ad, Na is printed corresponds to a first label portion; and the printing label set LLC on which the destination Ad, Na and catalog number KN are printed corresponds to a first printing label set. Further, the destination Ad, Na and catalog number KN performed at a next timing of the above certain point correspond to remaining one of the first data and remaining one of the second data, respectively; the label portion 950 on which the destination Ad, Na is printed corresponds to a second label portion; and the printing label set LCC on which the destination Ad, Na and catalog number KN are printed corresponds to a second printing label set.

The third embodiment is not limited to the above description and various modifications may be made therein without departing from the spirit and scope of the above described embodiment.

When the term "vertical", "parallel", or "plane" is used in the above description, the term is not used in a strict sense. That is, the term "vertical", "parallel", and "plane" refer to "substantially vertical", "substantially parallel", or "substantially plane", respectively, where design/manufacturing tolerance and error are allowed.

When the term "same", "equal", or "different" concerning the outer appearance or size is used in the above description, the term is not used in a strict sense. That is, the term "same", "equal", and "different" refer to "substantially same", "substantially equal", or "substantially different", respectively, where design/manufacturing tolerance and error are allowed.

However, the term "same", "equal", or "different" concerning a value used as a predetermined determination criterion or representing a predetermined range, such as a threshold value (see the flowchart of FIG. 20) or a reference value is used in a strict sense unlike the above.

In the above description, the arrows in FIG. 4 represent an example of the flow of a signal and do not limit the signal flow direction.

The flowchart illustrated in FIG. 12 does not limit the present disclosure to the illustrated processing flow, and addition/deletion and/or rearrangement of steps may be made to the processing flow without departing from the spirit and technical ideas of the disclosure.

Further to the above description, the various modifications and the methodologies described above may be suitably combined to utilize.

The present disclosure may be worked by making various changes within the spirit and scope of the disclosure.

What is claimed is:

1. A printing apparatus comprising:

a conveying portion configured to convey a tape, the tape comprising a first sheet in a form of an elongated rectangular shape and having a first surface, and a second sheet in a form of an elongated rectangular shape and affixed to the first surface of the first sheet, the second sheet including two label portions and a non-label portion, each label portion being segmented from the non-label portion by a cut line, the non-label portion being defined as a region of the second sheet other than the label portions, each of the two label portions having a first label portion and a second label portion disposed in a longitudinal direction of the tape;

a printing portion configured to perform printing on the tape conveyed by the conveying portion; and a controller configured to perform:

acquiring two pieces of first data and two pieces of second data from a database that includes the two pieces of the first data and the two pieces of the second data, wherein the two pieces of the second data correspond to the two pieces of the first data;

controlling the conveying portion and the printing portion based on the two pieces of the first data and the two pieces of the second data acquired in the acquiring; and generating a first print label set and a second print label set, the first print label set including the first label portion on which printing is performed based on one piece of the first data and part of the non-label portion on which printing is performed based on one piece of the second data corresponding to the one piece of the first data adjacent to the first label portion, the second print label set including the second label portion on which printing is performed based on remaining one piece of the first data and part of the non-label portion on which printing is performed based on remaining one piece of the second data corresponding to the remaining one piece of the first data adjacent to the second label portion, wherein the one piece of the second data indicates first relevant material that is associated with a first adherend, to which the first label portion printed with the one piece of the first data is to be affixed, and wherein the remaining one piece of the second data indicates second relevant material that is associated with a second adherend, to which the second label portion printed with the remaining one piece of the first data is to be affixed.

2. The printing apparatus according to claim 1, further comprising a setting portion configured to set a template on which a first input frame and a second input frame are disposed, wherein the controller is configured to further generate the first print label set and the second print label set by assigning the first data in the first input frame and assigning the second data in the second input frame.

3. The printing apparatus according to claim 1, wherein the controller is configured to control the conveying portion and the printing portion to further print, on the second sheet, a figure correlating the one piece of the first data and the one piece of the second data and a figure correlating the remaining one piece of the first data and the remaining one piece of the second data.

4. The printing apparatus according to claim 1, wherein the controller is configured to further generate:

the first print label set in which:

text of the one piece of the first data is printed in a forward direction on one side portion of the first label portion, text of the one piece of the first data is printed in a backward direction on another side portion of the first label portion, the one side portion and the another side portion of the first label portion confronting each other with respect to a folding line of the first label portion, and text of the one piece of the second data is printed, adjacent to the first label portion, in the forward direction on the non-label portion closer to the one side portion than to the another side portion of the first label portion; and the second print label set in which:

text of the remaining one piece of the first data is printed in the forward direction on one side portion of the second label portion, text of the remaining one piece of the first data is printed in the backward direction on another side portion of the second label portion, the one side portion and the another side portion of the second label portion confronting each other with respect to a folding line of the second label portion, and text of the remaining one piece of the second data is printed, adjacent to the second label portion, in the forward direction on the non-label portion closer to the one side portion than to the another side portion of the second label portion.

5. A printing apparatus comprising:

a conveying portion configured to convey a printing tape, the printing tape having an elongated peeling sheet and an elongated adhesive sheet, the adhesive sheet having a base material and an adhesive layer on a pair of opposite sides thereof, the adhesive sheet being stuck to a surface of the peeling sheet such that the base material, the adhesive layer, and the peeling sheet are laminated in this order in a laminated direction and such that the adhesive sheet is capable of being peeled off the surface of the peeling sheet;

a printing portion configured to perform printing on the base material of the adhesive sheet of the printing tape conveyed by the conveying portion; and a controller configured to control the conveying portion and the printing portion, the adhesive sheet having a plurality of label portions and a non-label portion, the plurality of label portions being arranged in a conveying direction, in which the conveying portion conveys the printing tape, each label portion being defined as a region of the adhesive sheet surrounded by a cut line that passes through the adhesive sheet in the laminated direction, the non-label portion being defined as a region of the adhesive sheet other than the label portions, each label portion having a label main body portion and a winding portion connected to the label main body portion, the label main body portion including a first label region and a second label region segmented from the first label region by a perforation line that passes through the adhesive sheet in the laminated direction, the perforation line extending discontinuously in the conveying direction, the first label region and the second label region being symmetric with each other with respect to the perforation line, the winding portion protruding in the conveying direction from a downstream end of the first label region in the conveying direction, the plurality of label portions including two label portions, the two label portions including one label portion and a remaining one label portion, the controller being configured to perform:

acquiring two pieces of first data and two pieces of second data from a database that includes the two pieces of the first data and the two pieces of the second data, the two pieces of the first data including one piece of the first data and a remaining one piece of the first data, the two pieces of the second data including: one piece of the second data corresponding to the one piece of the first data; and a remaining one piece of the second data corresponding to the remaining one piece of the first data;

controlling the conveying portion and the printing portion based on the two pieces of the first data and the two pieces of the second data acquired in the acquiring; and generating two print label sets, the two print label sets including one print label set and a remaining one print label set, the one print label set including: the one label portion, whose first label region and second label region are each printed with the one piece of the first data; and part of the non-label portion, in which the one piece of the second data is printed at a second-data printed position for the one print label set, the second-data printed position for the one print label set being defined as a position that is downstream from the second label region of the one label portion in the conveying direction and that is closer to the second label region of the one label portion than to the first label region of the one label portion, and the remaining one print label set including: the remaining one label portion, whose first label region and second label region are each printed with the remaining one piece of the first data; and part of the non-label portion, in which the remaining one piece of the second data is printed at a second-data printed position for the remaining one print label set, the second-data printed position for the remaining one print label set being defined as a position that is downstream from the second label region of the remaining one label portion in the conveying direction and that is closer to the second label region of the remaining one label portion than to the first label region of the remaining one label portion.

6. The printing apparatus according to claim 5, further comprising a setting portion configured to set a template on which a pair of first input frames and a second input frame are arranged, the pair of first input frames including: a first input frame for the first label region that is positioned in correspondence with a position of the first label region; and a first input frame for the second label region that is positioned in correspondence with a position of the second label region, the second input frame being positioned in correspondence with the second-data printed position, wherein the controller is configured to generate the one print label set by assigning the one piece of the first data in each of the first input frame for the first label region and the first input frame for the second label region and assigning the one piece of the second data in the second input frame, and wherein the controller is configured to generate the remaining one print label set by assigning the remaining one piece of the first data in each of the first input frame for the first label region and the first input frame for the second label region and assigning the remaining one piece of the second data in the second input frame.

7. The printing apparatus according to claim 5, wherein the controller is configured to further perform:

printing a figure correlating the one piece of the first data and the one piece of the second data at an intermediate position between the second label region of the one label portion and the second-data printed position for the one print label set; and printing a figure correlating the remaining one piece of the first data and the remaining one piece of the second data at an intermediate position between the second label region of the remaining one label portion and the second-data printed position for the remaining one print label set.

8. The printing apparatus according to claim 1, wherein, in the first print label set, a position in the non-label portion, at which printing is performed based on the one piece of the second data, is aligned with at least part of the first label portion in a widthwise direction of the tape, and wherein, in the second print label set, a position in the non-label portion, at which printing is performed based on the remaining one piece of the second data, is aligned with at least part of the second label portion in the widthwise direction of the tape.

9. The printing apparatus according to claim 5, wherein, in the one print label set, the second-data printed position is aligned with at least part of the one label portion in a widthwise direction of the printing tape, and wherein, in the remaining one print label set, the second-data printed position is aligned with at least part of the remaining one label portion in the widthwise direction of the printing tape.

* * * * *